United States Patent
Cuthbertson et al.

(10) Patent No.: US 11,952,267 B2
(45) Date of Patent: Apr. 9, 2024

(54) MODIFICATION TO ROUGH POLYSILICON USING ION IMPLANTATION AND SILICIDE

(71) Applicant: INVENSENSE, INC., San Jose, CA (US)

(72) Inventors: Alan Cuthbertson, San Jose, CA (US); Daesung Lee, San Jose, CA (US)

(73) Assignee: INVENSENSE, INC., San Jose, CA (US)

( * ) Notice: Subject to any disclaimer, the term of this patent is extended or adjusted under 35 U.S.C. 154(b) by 0 days.

(21) Appl. No.: 17/584,698

(22) Filed: Jan. 26, 2022

(65) Prior Publication Data

US 2022/0144628 A1    May 12, 2022

Related U.S. Application Data

(62) Division of application No. 16/796,310, filed on Feb. 20, 2020, now Pat. No. 11,267,699.

(Continued)

(51) Int. Cl.
*B81C 1/00* (2006.01)
*B81B 3/00* (2006.01)

(52) U.S. Cl.
CPC .......... *B81C 1/00166* (2013.01); *B81B 3/001* (2013.01); *B81B 3/0056* (2013.01);
(Continued)

(58) Field of Classification Search
CPC .......... B81C 1/00166; B81C 1/00031; B81C 2201/0166; B81C 2201/115;
(Continued)

(56) References Cited

U.S. PATENT DOCUMENTS 6,316,323 B1 *  11/2001  Fang ................. H01L 29/66553
                                                257/E21.205
7,767,483 B1 *   8/2010  Waters ................ G01P 15/0802
                                                257/E29.234

(Continued)

OTHER PUBLICATIONS

Non-Final Office Action received for U.S. Appl. No. 16/796,310 dated Jul. 14, 2021, 37 pages.

(Continued)

*Primary Examiner* — Yasser A Abdelaziez
(74) *Attorney, Agent, or Firm* — Amin, Turocy & Watson, LLP

(57) ABSTRACT

A modification to rough polysilicon using ion implantation and silicide is provided herein. A method can comprise depositing a hard mask on a single crystal silicon, patterning the hard mask, and depositing metal on the single crystal silicon. The method also can comprise forming silicide based on causing the metal to react with exposed silicon of the single crystal silicon. Further, the method can comprise removing unreacted metal and stripping the hard mask from the single crystal silicon. Another method can comprise forming a MEMS layer based on fusion bonding a handle MEMS with a device layer. The method also can comprise implanting rough polysilicon on the device layer. Implanting the rough polysilicon can comprise performing ion implantation of the rough polysilicon. Further, the method can comprise performing high temperature annealing. The high temperature can comprise a temperature in a range between around 700 and 1100 degrees Celsius.

24 Claims, 22 Drawing Sheets

Related U.S. Application Data

(60) Provisional application No. 62/808,379, filed on Feb. 21, 2019.

(52) U.S. Cl.
CPC ........ B81B 3/0089 (2013.01); *B81B 2203/04* (2013.01); *B81C 1/00031* (2013.01); *B81C 2201/0166* (2013.01); *B81C 2201/115* (2013.01)

(58) Field of Classification Search
CPC . B81C 2203/036; B81B 3/001; B81B 3/0056; B81B 3/0089; B81B 2203/04; B81B 2201/0235; B81B 2201/0242
See application file for complete search history.

(56) References Cited

U.S. PATENT DOCUMENTS

| | | | |
|---|---|---|---|
| 10,427,929 | B1 | 10/2019 | Montez et al. |
| 2008/0121887 | A1 | 5/2008 | Choi et al. |
| 2008/0237757 | A1 | 10/2008 | Inoue et al. |
| 2011/0133295 | A1* | 6/2011 | Fujii ................. H01L 24/73 257/E21.546 |
| 2014/0264648 | A1 | 9/2014 | Chu et al. |
| 2015/0162483 | A1 | 6/2015 | Weidman et al. |
| 2017/0241854 | A1 | 8/2017 | Sooriakumar et al. |
| 2019/0027522 | A1* | 1/2019 | Kropelnicki ............... G01J 5/20 |
| 2019/0382261 | A1* | 12/2019 | Lee ........................ B81B 3/0016 |
| 2020/0095119 | A1* | 3/2020 | Chang ................. B81C 1/00095 |
| 2020/0096336 | A1* | 3/2020 | Cook .................... B81B 3/0097 |
| 2021/0107785 | A1* | 4/2021 | Lee ..................... B81C 1/00238 |

OTHER PUBLICATIONS

Bhusan et al., "Nanotribology and Nanmechanics of MEMS Devices", Proceedings of Ninth International Workshop on Micro Electromechanical Systems, 1996, pp. 91-98.

Paik et al. ("Roughened polysilicon for low impedance microelectrodes in neural probes," J. Micromech. Microeng. 13, pp. 373-379, 2003) (Year: 2003).

NPL Search History_01 Record (Year: 2021).

NPL Search History _02 Record (Year: 2021).

Notice of Allowance received for U.S. Appl. No. 16/796,310 dated Oct. 27, 2021, 45 pages.

Edrei et al., "Influence of implantation and annealing on the surface topography of amorphous and polysilicon thin films," Journal of Vacuum Science & Technology A, vol. 20, No. 344, 2002, 7 pages.

* cited by examiner

MODIFICATION TO ROUGH POLYSILICON USING ION IMPLANTATION AND SILICIDE

CROSS-REFERENCE TO RELATED APPLICATIONS

This application is a divisional patent application of U.S. patent application Ser. No. 16/796,310, filed Feb. 20, 2020, entitled "MODIFICATION TO ROUGH POLYSILICON USING ION IMPLANTATION AND SILICIDE", pending, and assigned to the assignee hereof, which claims the benefit of U.S. Provisional Application Ser. No. 62/808,379, filed Feb. 21, 2019, and entitled "MODIFICATION TO ROUGH POLYSILICON USING ION IMPLANTATION AND SILICIDE," the entirety of which is expressly incorporated herein by reference.

BACKGROUND

Micro-Electro-Mechanical Systems (MEMS) is a class of structures and/or devices that are fabricated using semiconductor-like processes. MEMS structures and/or devices exhibit mechanical characteristics that include the ability to move or to deform. Examples of MEMS devices include, but are not limited to, gyroscopes, accelerometers, magnetometers, pressure sensors, radio-frequency components, and so on. Silicon wafers that include MEMS structures are referred to as MEMS wafers. Unique challenges exist to provide MEMS devices and/or structures with improved performance and reliability.

BRIEF DESCRIPTION OF THE DRAWINGS

Various non-limiting embodiments are further described with reference to the accompanying drawings in which.

DETAILED DESCRIPTION

Figure 1A:
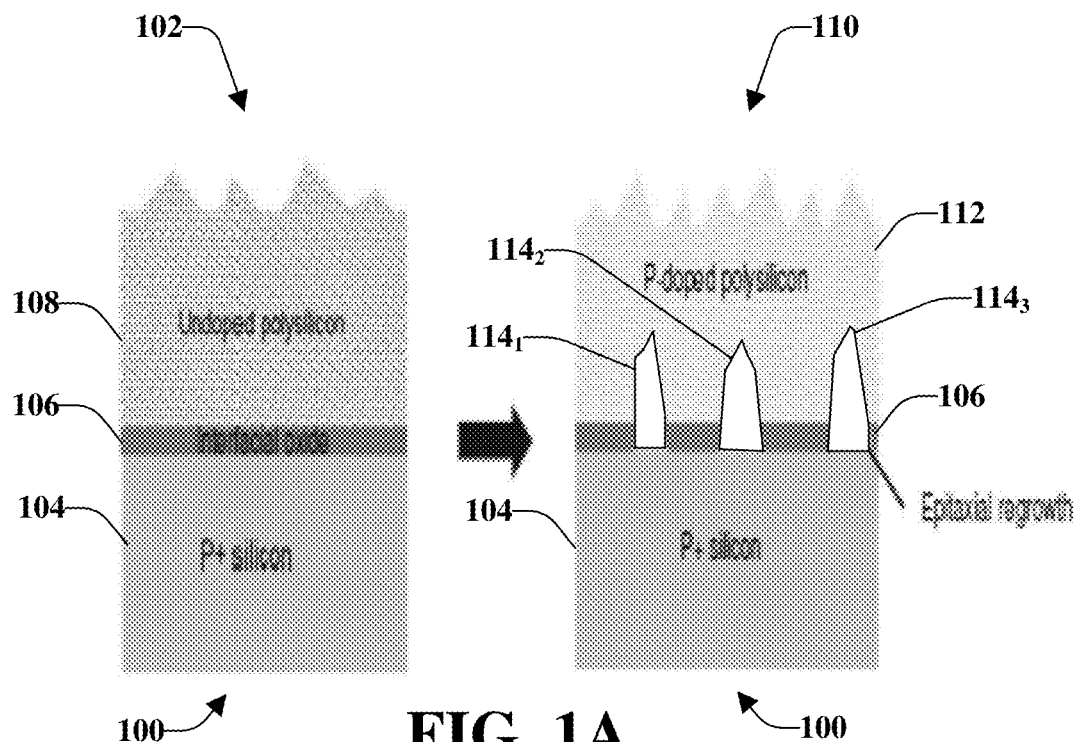
FIG. 1A illustrates an example representation of a polysilicon module undergoing a traditional rough polysilicon module doping process for MEMS fabrication.

One or more embodiments are now described more fully hereinafter with reference to the accompanying drawings in which example embodiments are shown. In the following description, for purposes of explanation, numerous specific details are set forth in order to provide a thorough understanding of the various embodiments.

According to an embodiment, provided is a method of forming a MEMS device. The method can comprise forming a MEMS layer based on fusion bonding a handle MEMS with a device layer. The method also can comprise implanting rough polysilicon on the device layer. Implanting the rough polysilicon can comprise performing ion implantation of the rough polysilicon. Further, the method can comprise performing high temperature annealing. The high temperature can comprise a temperature in a range between around 700 and 1100 degrees Celsius.

In an example, performing ion implantation can increase a surface roughness of the rough polysilicon. The rough polysilicon can be undoped. Further, in some implementations, the a roughness of the rough polysilicon is between 12 nm RMS to 30 nm RMS.

According to some implementations, performing the high temperature annealing can comprise doping the rough polysilicon from implanted dopants. In accordance with some implementations, the temperature is higher than another temperature utilized for a polysilicon deposited on a single crystal silicon.

Another embodiment provided herein is a MEMS device that can comprise an inter-metal dielectric layer and a metal layer in contact with and over the inter-metal dielectric layer. The MEMS device also can comprise a silicided MEMS device separated from the metal layer via a vertical sensing gap area and a doped silicon layer in contact with and over the silicided MEMS device.

The silicided MEMS device can be a silicided electrode according to some implementations. In an example, the silicided MEMS device can comprise at least one of cobalt disilicide (CoSi2), titanium disilicide (TiSi2), nickel silicide (NiSi), Platinum Silicide (PtSi), Tantalum disilicide (TaSi2), and tungsten disilicide (WSi2). The silicided MEMS device can provide surface roughness according to some implementations. Further, the vertical sensing gap area can be a metal-to-metal capacitor between the metal layer and the silicided MEMS device.

According to another embodiment, provided is a method of forming a MEMS device. The method can comprise depositing a hard mask on a single crystal silicon, patterning the hard mask, and depositing metal on the single crystal silicon. The method also can comprise forming silicide based on causing the metal to react with exposed silicon of the single crystal silicon. Further, the method can comprise removing unreacted metal and stripping the hard mask from the single crystal silicon.

In some implementations, the metal can comprise at least one of titanium (Ti), cobalt (Co), nickel (Ni), platinum (Pt), tantalum (Ta), and tungsten (W). Further, causing the metal to react can comprise heating the metal to a temperature between about 400 degrees Celsius and 1000 degrees Celsius. The silicide can comprise cobalt disilicide (CoSi2) and/or titanium disilicide (TiSi2).

FIG. 1A illustrates an example representation of a polysilicon module 100 undergoing a traditional rough polysilicon module doping process for MEMS fabrication. As indicated at a first process 102, the polysilicon module 100 can comprise a first layer 104, a second layer 106, and a third layer 108. The first layer 104 can comprise a single crystal silicon, which can be P+ doped, for example. The second layer 106 can comprise interfacial oxide and the third layer 108 can comprise undoped polysilicon, for example.

The polysilicon module 100 can be pre-cleaned, such as undergoing a two-step standard cleaning process. Further, rough polysilicon deposition is performed, where the rough polysilicon can be updoped. The polysilicon (e.g., the third layer 108) is deposited on single crystal silicon P+ (e.g., the first layer 104) to introduce surface roughness for stiction reduction.

After deposition of the rough polysilicon, high temperature annealing can be performed. The high temperature anneal process can be for drive dopant, such as to dope the polysilicon from the P+ substrate (e.g., the first layer 104). As indicated at a second process 110, the undoped polysilicon (e.g., the third layer 108) becomes a P-doped polysilicon layer 112. Further, the polysilicon module 100 has areas $114_1$, $114_2$, and $114_3$ of epitaxial regrowth. It is noted that although three areas of epitaxial regrowth are shown, there can be more than three areas or fewer than three areas in some cases.

Figure 1B:
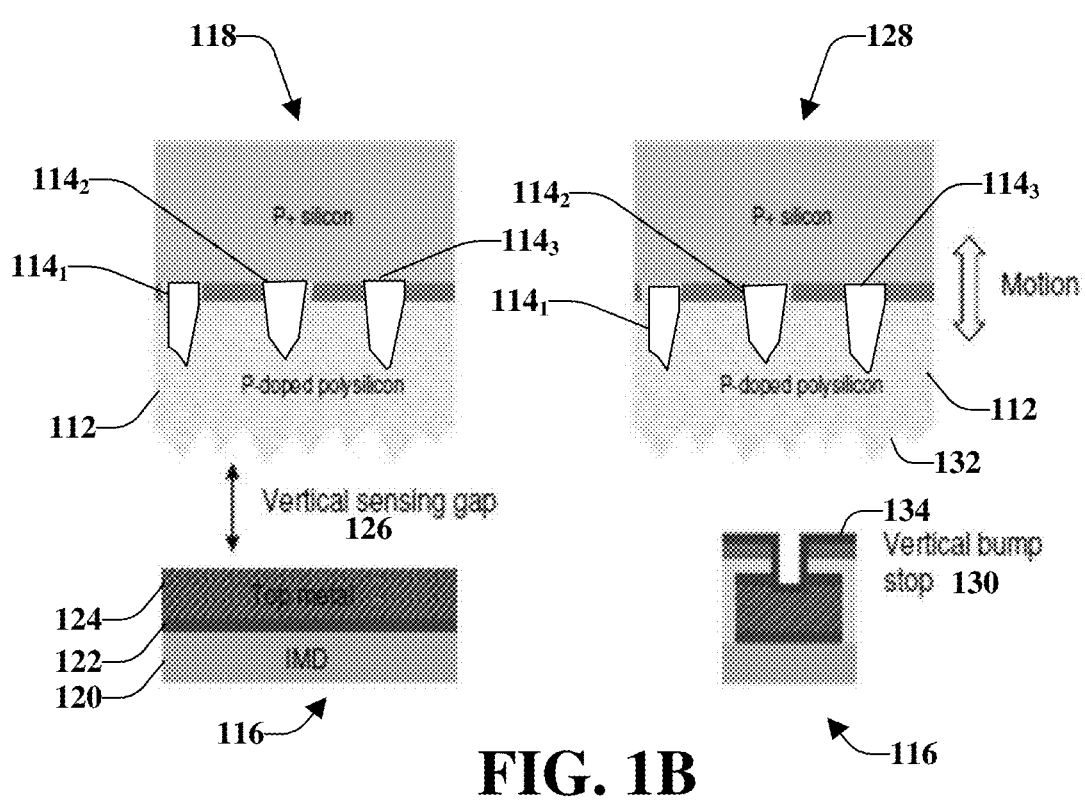
FIG. 1B illustrates an example representation of a device that comprises the polysilicon module of FIG. 1A attached to a substrate.

FIG. 1B illustrates an example representation of a device 116 that comprises the polysilicon module of FIG. 1A attached to a substrate. As indicated at a first embodiment 118, the device can comprise a substrate 120, which can be an Inter-Metal Dielectric (IMD) substrate. Placed over and in contact with the substrate 120 can be a barrier layer 122 comprising titanium and titanium nitride. Further, placed over and in contact with the insulating layer 122 can be a metal layer 124. The polysilicon module of FIG. 1A can be placed over the metal layer 124 with a vertical sensing gap 126 between the metal layer 124 and the P-doped polysilicon layer 112 of the polysilicon module of FIG. 1A.

As indicated at a second embodiment 128, a vertical bump stop 130 is provided. A motion of the device is indicated by the arrow. It is noted that the polysilicon module (e.g., the P-doped polysilicon layer 112) can have a contact surface 132, which can be a rough polysilicon surface. Further, the vertical bump stop 130 can comprise a corresponding surface 134 (out of plane).

There are various limitations associated with the embodiments of FIG. 1A and FIG. 1B. For example, polysilicon annealing is used in order to dope the polysilicon from the p+ substrate. The deposited polysilicon is undoped. In another example, higher temperature annealing improves doping. However, the higher temperature annealing degrades roughness due to epitaxial regrowth (e.g., the areas $114_1$, $114_2$, and $114_3$ of epitaxial regrowth). The epitaxial regrowth can be pronounced where an interface oxide is thin. Additionally, lowering the anneal temperature of the embodiments of FIG. 1A and FIG. 1B can significantly reduce the doping level in the polysilicon.

The interfacial oxide (e.g., the second layer 106) must be tightly controlled. For example, the interfacial oxide should be thick enough to prevent epitaxial re-alignment and thin enough to allow B diffusion. These are competing mechanisms and the process window may not be large. In addition, variability in doping (which can be caused by variability in interfacial oxide) will degrade sensor performance.

Figure 2A:
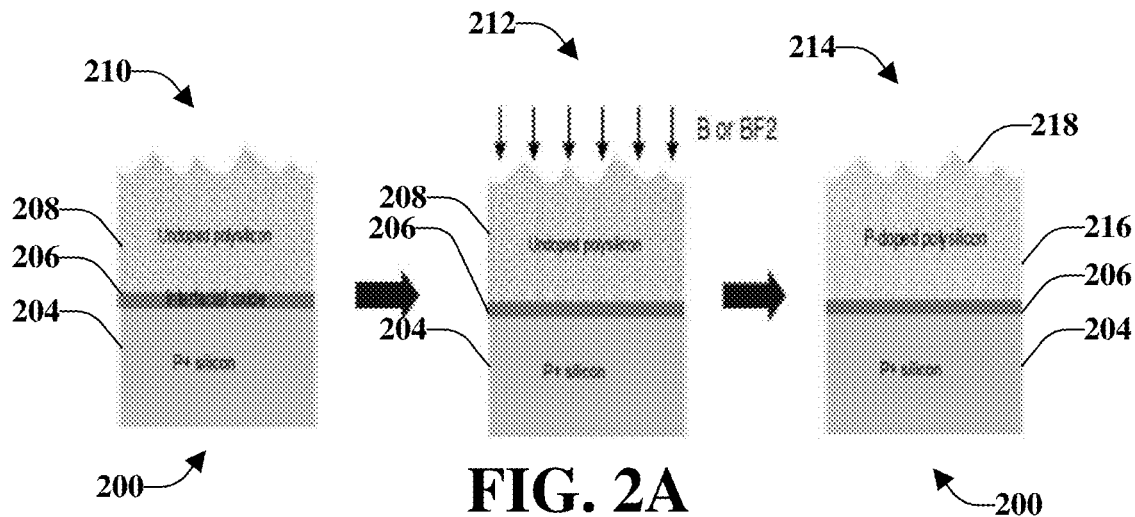
FIG. 2A illustrates an example, non-limiting, representation of a polysilicon module in accordance with one or more embodiments described herein.
Figure 2B:
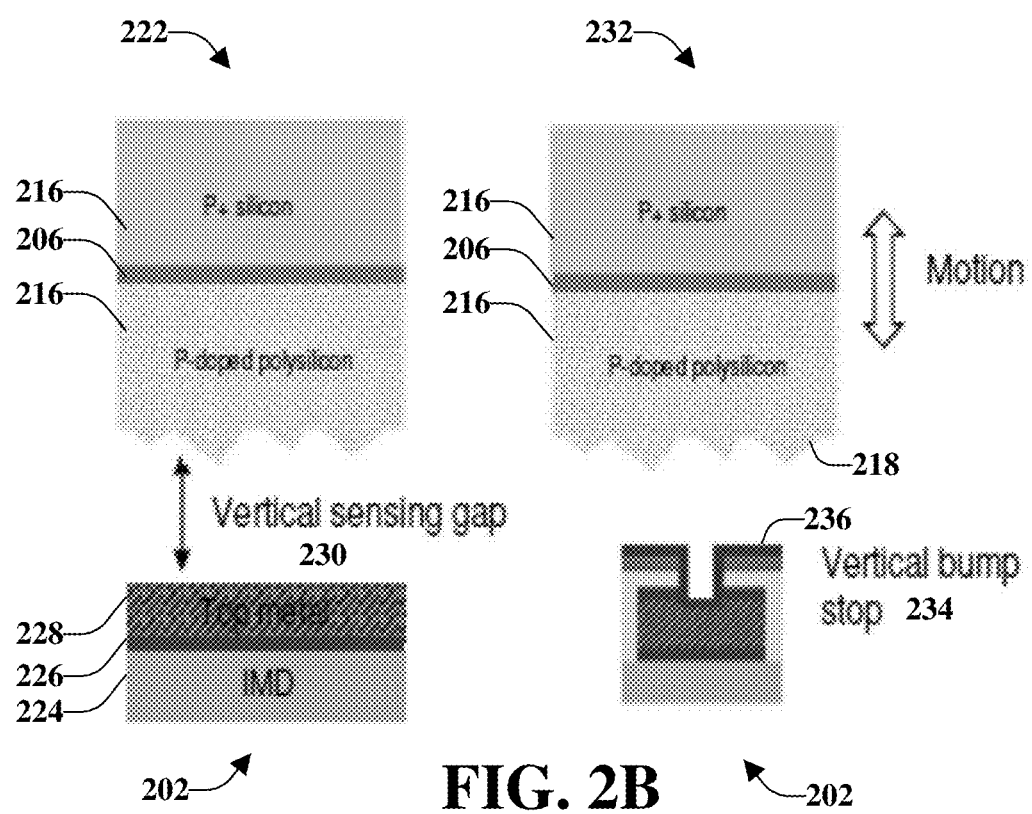
FIG. 2B illustrates an example, non-limiting, representation of a device that includes the polysilicon module of FIG. 2A.

FIG. 2A illustrates an example, non-limiting, representation of a polysilicon module 200 in accordance with one or more embodiments described herein. FIG. 2B illustrates an example, non-limiting, representation of a device 202 that includes the polysilicon module 200 of FIG. 2A. Repetitive description of like elements employed in other embodiments described herein is omitted for sake of brevity.

The various aspects can provide a polysilicon module doping robustness improvement with ion implantation. The polysilicon module 200 is similar to the polysilicon module 100 of FIG. 1A and can comprise a first layer 204, a second layer 206, and a third layer 208. The first layer 204 can comprises a single crystal silicon, which can be P+ doped, for example. The second layer 206 can comprise interfacial oxide and the third layer 208 can comprise undoped polysilicon, for example.

As indicated at a first process 210, the polysilicon module 200 can be pre-cleaned by standard cleaning processes. Further, rough polysilicon deposition is performed, where the rough polysilicon can be updoped. The polysilicon (e.g., the third layer 208) is deposited on single crystal silicon P+ (e.g., the first layer 204) to introduce surface roughness for stiction reduction.

As indicated at a second process 212, polysilicon can be implanted (e.g., B11, which is an isotope of Boron, or BF2, which is Boron difloride). Further, as indicated at a third process 214, low temperature anneal, Rapid Thermal Annealing (RTA), or both low temperature anneal and RTA can be performed.

In further detail, implantation of a rough polysilicon layer 216, as indicated by the third process 214 can allow the annealing conditions to be relaxed and still have a high active doping level at a surface 218 of the polysilicon module. There can also be sensor performance improvement. Since the annealing temperature can be reduced, the process window for avoiding epitaxial re-alignment can be increased significantly. In addition, epitaxial regrowth can be less sensitive to the interfacial oxide. Further, implanted polysilicon can have a higher surface roughness compared to undoped polysilicon, which provides further advantages. Additional details related to this implementation will be provided below with respect to FIGS. 4-10.

With reference now to FIG. 2B, as indicated at a first embodiment 222, the device 202 can comprise a substrate 224, which can be an Inter-Metal Dielectric (IMD) substrate. Placed over and in contact with the substrate 224 can be a barrier layer 226. Further, placed over and in contact with the insulating layer 226 can be a metal layer 228. The polysilicon module of FIG. 2A can be placed over the metal layer 228 with a vertical sensing gap 230 between the metal layer 228 and the rough polysilicon layer 216 of the polysilicon module of FIG. 2A.

As indicated at a second embodiment 232, a vertical bump stop 234 is provided. A motion of the device is indicated by the arrow. It is noted that the polysilicon module (e.g., the rough polysilicon layer 216) can have the contact surface 218, which can be a rough polysilicon surface. Further, the vertical bump stop 234 can comprise a corresponding surface 236 (out of plane).

Figure 3:
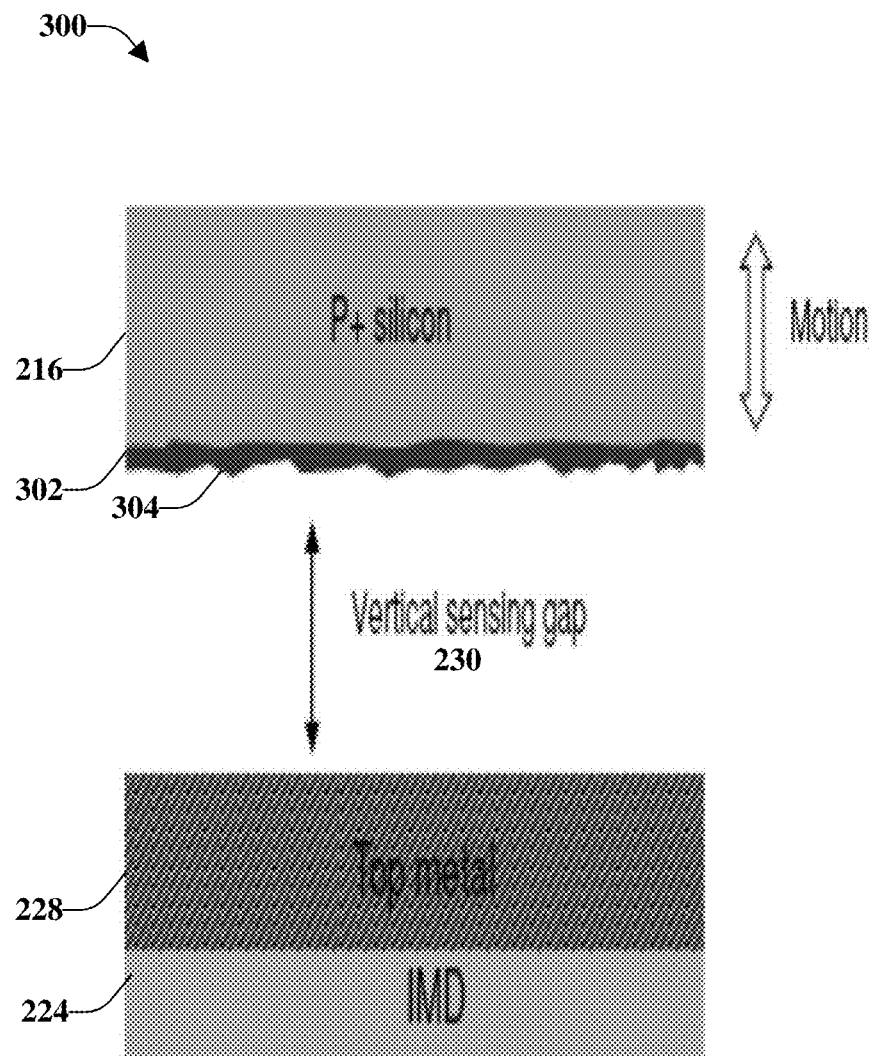
FIG. 3 illustrates an example, non-limiting, representation of a polysilicon module that comprises a doping robustness improvement with silicide in accordance with one or more embodiments described herein.

FIG. 3 illustrates an example, non-limiting, representation of a polysilicon module 300 that comprises a doping robustness improvement with silicide in accordance with one or more embodiments described herein. Repetitive description of like elements employed in other embodiments described herein is omitted for sake of brevity.

In this embodiment, a silicided module is a replacement for rough polysilicon. Accordingly, elimination of a rough polysilicon module can be facilitated using a silicided layer 302, which can be an actuation device layer. A surface 304 of the silicided layer 302 can be silicide. For example, the silicide can be thin cobalt disilicide (COSi2) and/or citanium disilicide (TiSi2) Complementary Metal-Oxide-Semiconductor (CMOS) based modules. Further, the silicided layer 302 can introduce surface roughness.

Silicidation can cause the vertical sensing gap 230 to be a true metal-metal capacitor, which can facilitate sensor performance improvement. In this embodiment, one mask can be added for a silicide block over the actuation (ACT) areas which can be etched by a Deep Reactive-Ion Etching (DRIE) process, for example.

The process for silicidation can include hard mask deposition (e.g. oxide) on single crystal silicon. Next, hard mask patterning can be performed followed by metal deposition (e.g. Cobalt (Co), Titanium (Ti), Nickel (Ni), Platinum (Pt), Tantalum (Ta), and Tungsten (W). Heating can then be performed to allow the metal to react with exposed silicon to form silicide (e.g. CoSi2, TiSi2). After heating, any unreacted metal can be removed by chemical etching. Thereafter the hard mask can be stripped. Additional details related to this implementation will be provided below with respect to FIGS. 11-20.

FIGS. 4-9 illustrate an example, non-limiting MEMS layer process flow for ion implantation in accordance with one or more embodiments described herein. Repetitive description of like elements employed in other embodiments described herein is omitted for sake of brevity.

Figure 4:
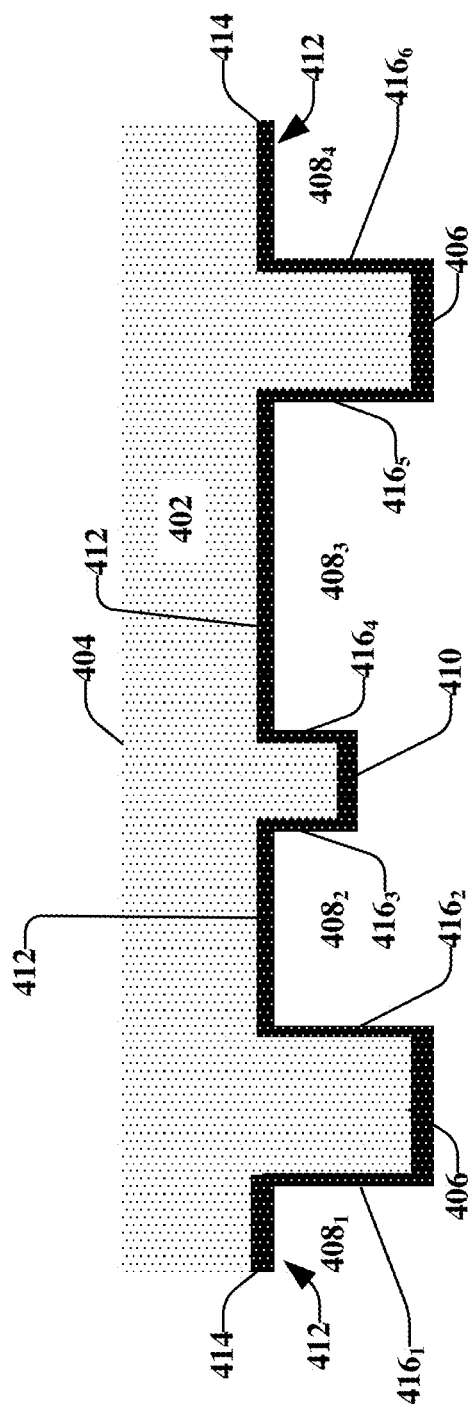
FIG. 4 illustrates a cross-sectional view of a first stage of formation of a MEMS layer with ion implantation in accordance with one or more embodiments described herein.

FIG. 4 illustrates a cross-sectional view of a first stage of formation of a MEMS layer with ion implantation in accordance with one or more embodiments described herein. A handle MEMS layer 402 is illustrated. The handle MEMS layer 402 can refer to a substrate that can be used as a carrier for a thinner substrate. The handle MEMS layer 402 can have a thickness that is thicker than other substrates. The handle MEMS layer 402 can initially comprise a first handle surface 404 and a second handle surface 406. The first handle surface 404 and the second handle surface 406 are on opposite sides of the handle MEMS layer 402.

One or more cavities can be formed in the handle MEMS layer 402. A cavity refers to an opening or recession in a substrate layer (e.g., the handle MEMS layer 402). In the example illustrated, there are four cavities, namely, a first cavity $408_1$, a second cavity $408_2$, a third cavity $408_3$, and a fourth cavity $408_4$. In some cases, the second cavity $408_2$ and the third cavity $408_3$ can be considered a single cavity. Although four cavities are illustrated, another number of cavities (e.g., one or more) can be formed in the handle MEMS layer 402 according to various implementations.

As illustrated, after the one or more cavities are formed, the handle MEMS layer 402 can have additional surfaces, such as the third handle surface 410. The third handle surface 410 represents a portion of the handle MEMS layer 402 that is not as thick as the portions represented by the second handle surface 406. Further, the third handle surface can be thicker than a fourth handle surface 412 formed by the one or more cavities. The third handle surface 410 and the fourth handle surface 412 are a same side of the handle MEMS layer 402 as the second handle surface 406 (e.g., the first handle surface is on the opposite side of the handle MEMS layer 402).

Upon or after the cavity formation, an insulating layer 414 can be bonded to the handle MEMS layer 402. According to an implementation, the insulating layer 414 can be an oxide layer. For example, the oxide layer can be bonded to the handle MEMS layer 402 via fusion bond oxide deposition.

The insulating layer 414 can line the handle MEMS layer 402. For example, the insulating layer 414 can cover the second handle surface 406, the third handle surface 410, and the fourth handle surface 412. Further, the insulating layer 414 can cover the sides of the portions of the handle MEMS layer 402 that are formed by the one or more cavities, as indicated at side portions $416_1$, $416_2$, $416_3$, $416_4$, $416_5$, and $416_6$.

Figure 5:
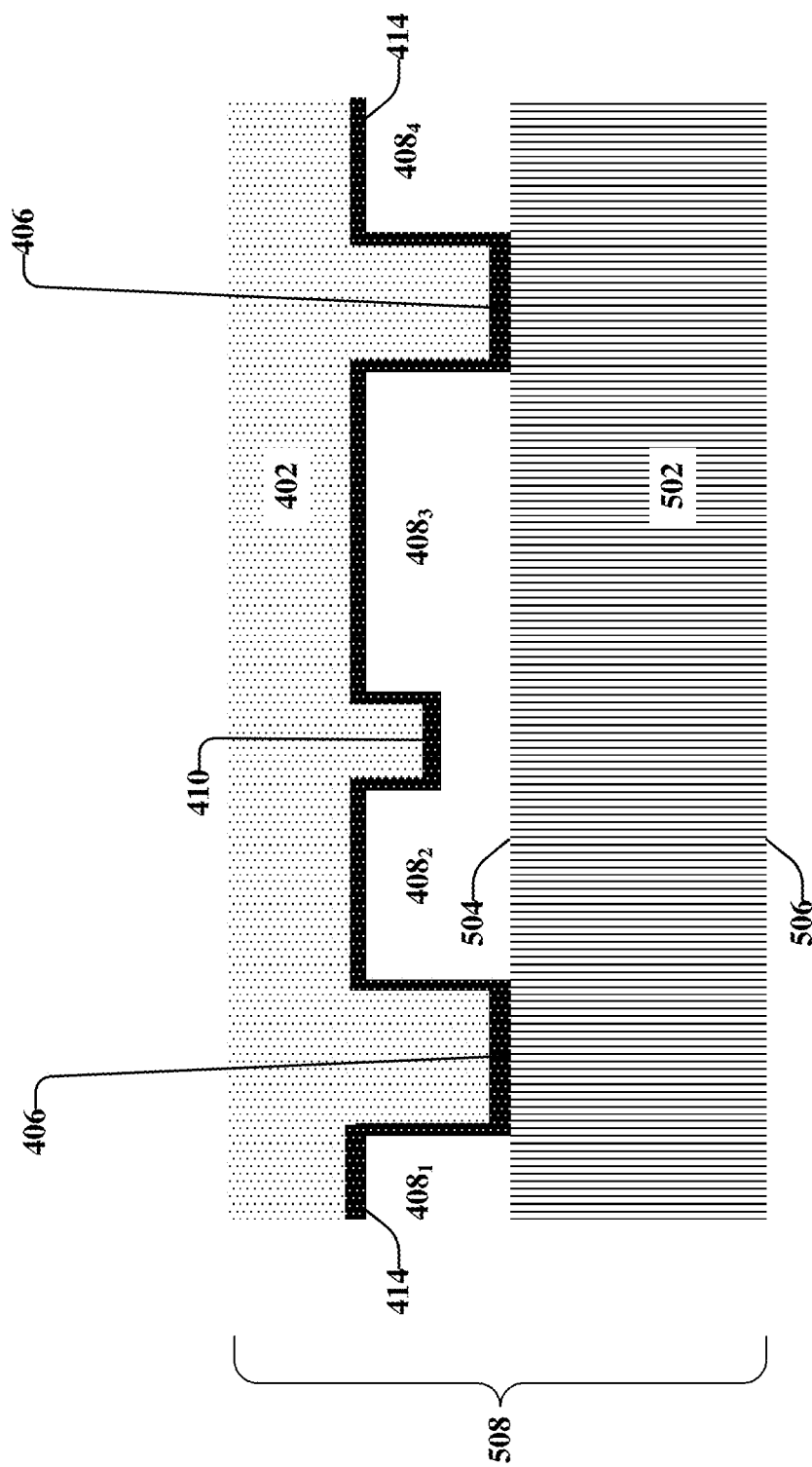
FIG. 5 illustrates a cross-sectional view of a next stage of formation of a MEMS layer comprising fusion bond and thinning processes in accordance with one or more embodiments described herein.

FIG. 5 illustrates a cross-sectional view of a next stage of formation of a MEMS layer comprising fusion bond and thinning processes in accordance with one or more embodiments described herein. Repetitive description of like elements employed in other embodiments described herein is omitted for sake of brevity.

At least a portion of the handle MEMS layer 402 can be bonded to at least a portion of a device layer 502. For example, as illustrated, the second handle surface 406 of the handle MEMS layer 402 can be bonded to corresponding portions of a first surface area 504 of the silicon layer. According to some implementations, the silicon layer can comprise P+, N+ doped, and/or N++ doped material. The bonding can comprise fusion bonding or another fusion technique or fusion process. According to some implementations, the device layer 502 can be a silicon layer.

Upon or after the bonding, a grinding and polishing process (or separate grinding and polishing processes) can be performed. According to some implementations, chemical-mechanical polishing or planarization (CMP) can be performed on the silicon layer. CMP is a polishing process that can be utilized to smooth surfaces. For example, CMP can utilize a chemical slurry formation and a mechanical polishing process to obtain the smooth surfaces. As illustrated, the CMP can create a level surface across at least a second surface area 506 of the silicon layer. The first surface area 504 and the second surface area 506 are located on opposite sides of the device layer 502. The handle MEMS layer 402 and the device layer 502 together can form a MEMS layer 508.

Figure 6:
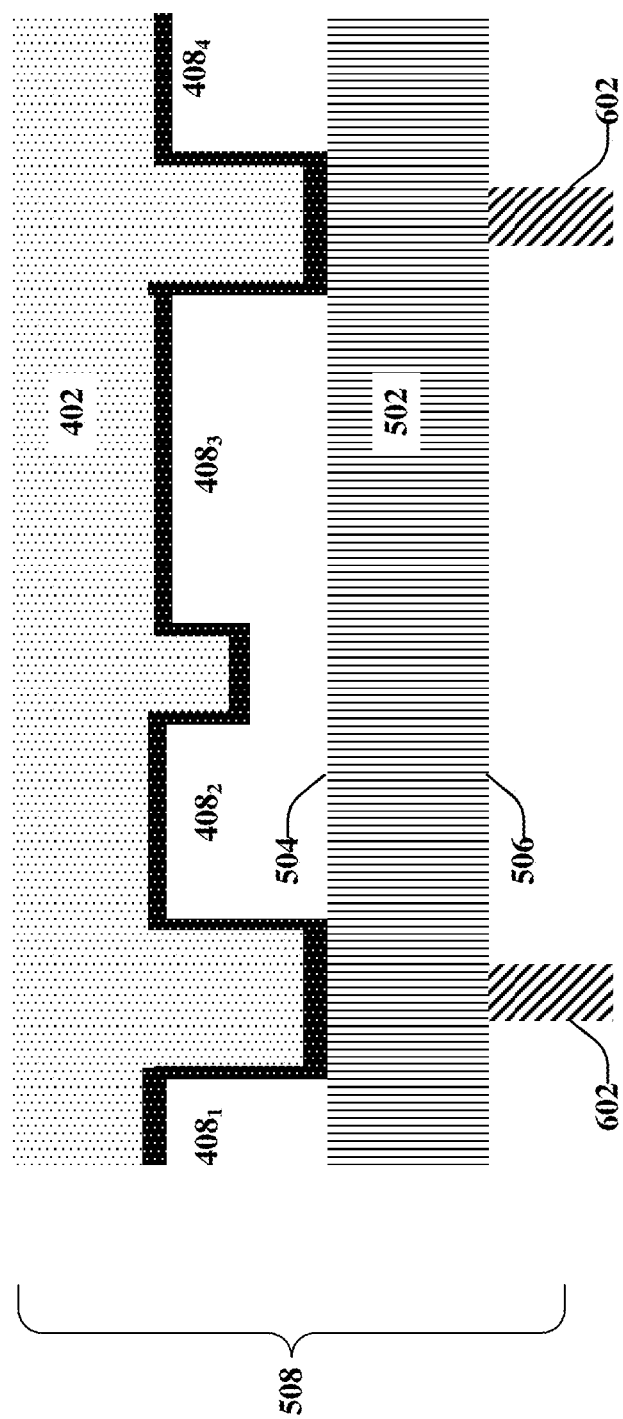
FIG. 6 illustrates a cross-sectional view of a next stage of formation of a MEMS layer comprising standoff patterning in accordance with one or more embodiments described herein.

FIG. 6 illustrates a cross-sectional view of a next stage of formation of a MEMS layer comprising standoff patterning in accordance with one or more embodiments described herein. Repetitive description of like elements employed in other embodiments described herein is omitted for sake of brevity.

Upon or after the formation of the MEMs layer 508, one or more standoffs 602 can be provided on the second surface area 506 of the device layer 502. Illustrated are two standoffs, however, the disclosed aspects are not limited to this implementation and fewer or more standoffs can be provided on the second surface area 506 of the device layer 502. According to some implementations, the one or more standoffs 602 can be patterned on the device layer.

Figure 7:
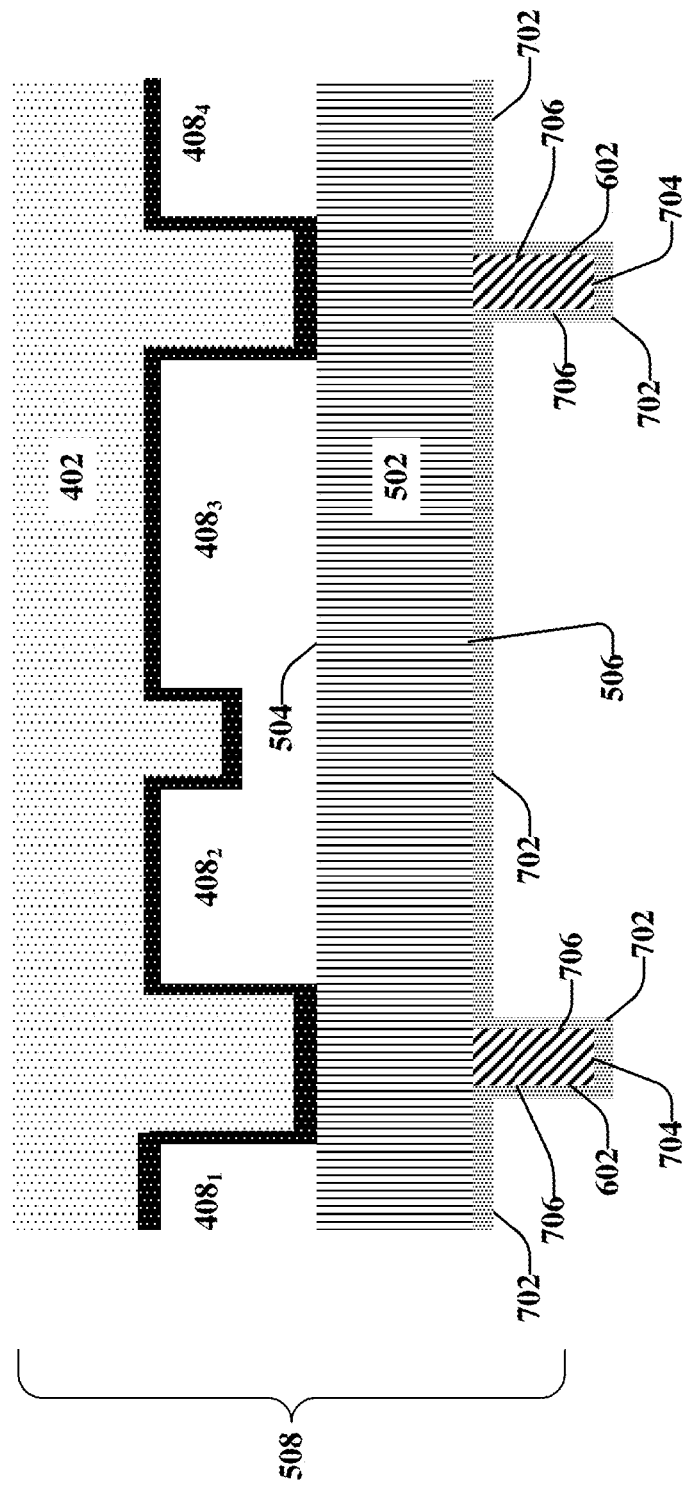
FIG. 7 illustrates a cross-sectional view of another stage of formation of a MEMS layer in accordance with one or more embodiments described herein.

FIG. 7 illustrates a cross-sectional view of another stage of formation of a MEMS layer in accordance with one or more embodiments described herein. Repetitive description of like elements employed in other embodiments described herein is omitted for sake of brevity.

Upon or after the one or more standoffs 602 are provided, pre-cleaning can be performed in one step or in multiple steps (e.g., two or more). Interfacial oxide can be formed as part of the cleaning process.

Upon or after the pre-cleaning, rough polysilicon 702 can be deposited on the second surface area 508 of the device layer 506 as well as on respective bottom surfaces 704 and side surfaces 706 of the one or more standoffs 602. The rough polysilicon can be undoped polysilicon. Deposition of the rough polysilicon 702 can introduce surface roughness, which can increase a surface roughness of the rough polysilicon 702.

Upon or after deposition of the rough polysilicon 702, ion implantation of the rough polysilicon 702 can be performed. According to some implementations, the ion implantation be performed with a B11 molecular ion and/or a BF2 molecular ion. The ion implantation of the rough polysilicon (e.g., B11 or BF2) can further increase the surface roughness of the rough polysilicon 702. According to some implementations, the roughness ranges of the rough polysilicon 702 can be, for example, around 12 nanometer (nm) to about 30 nm RMS (Root Mean Squared).

Next, high temperature annealing can be performed. In accordance with some implementations, performing the high temperature annealing can comprise doping the rough polysilicon 702 from implanted dopants. The temperature used for the high temperature annealing can comprise a temperature in a range between around 700 degrees Celsius and about 1100 degrees Celsius. In some cases, the temperature used for the high temperature annealing can comprise a temperature in a range between around 700 degrees Celsius and about 950 degrees Celsius. The annealing temperature can be higher than another temperature utilized for a polysilicon deposited on a single crystal silicon. For example, the deposition temperature can be around 575 and 650 degrees Celsius. Further, the annealing temperature can be about 700 to 1100 degrees Celsius.

The ion implantation and high temperature annealing can increase a process window for mitigating epitaxial re-alignment, according to some implementations.

Figure 8:
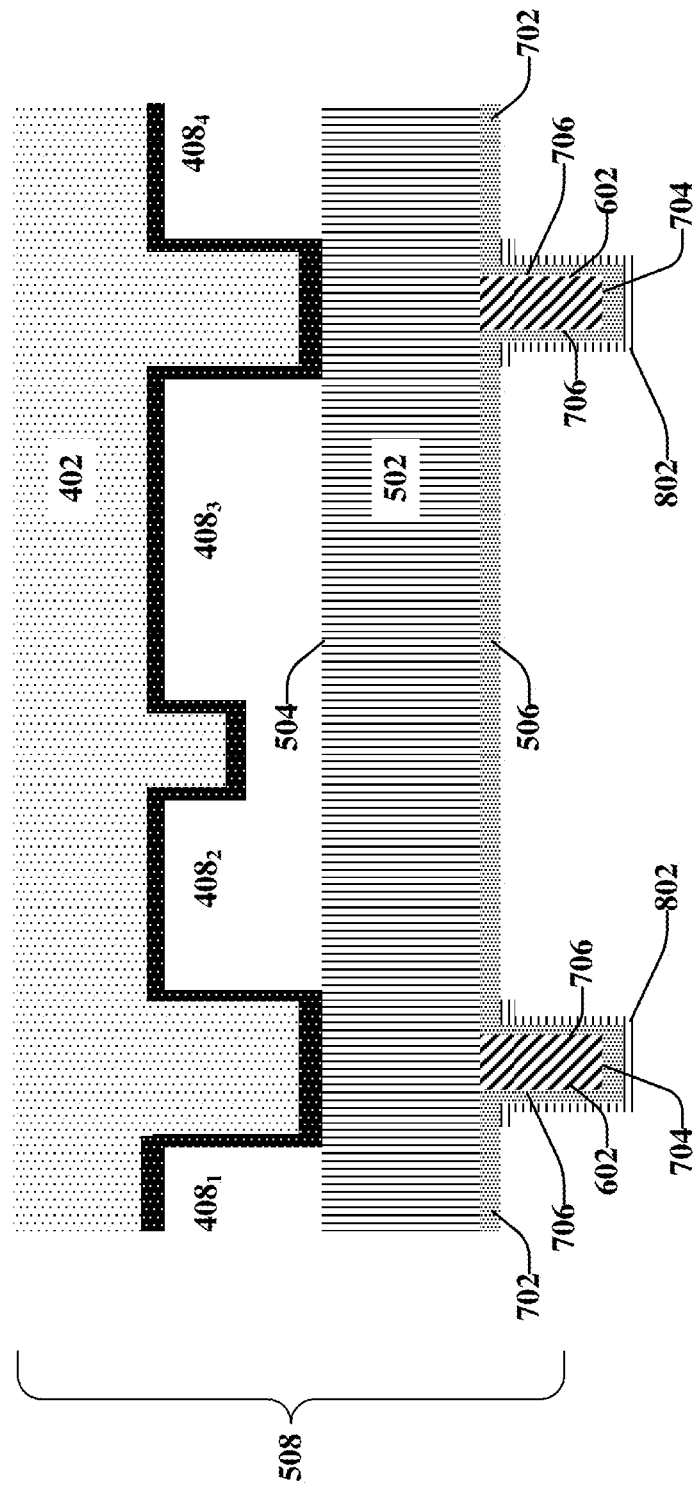
FIG. 8 illustrates a cross-sectional view of a further stage of formation of a MEMS layer in accordance with one or more embodiments described herein.

FIG. 8 illustrates a cross-sectional view of a further stage of formation of a MEMS layer in accordance with one or more embodiments described herein. Repetitive description of like elements employed in other embodiments described herein is omitted for sake of brevity.

As illustrated, a bonding layer 802 can be provided on the rough polysilicon 702 located at the respective bottom surfaces 704 and side surfaces 706 of the one or more standoffs 602. In some cases, the bonding layer 802 can be applied to portions of the second surface area 506 of the device layer 506 that are located on the sides of the one or more standoffs 602. For example, the bonding layer 802 can be provided by depositing and patterning the one or more standoffs 602. An example material for the bonding layer 802 can included, but is not limited to, germanium (Ge).

Figure 9:
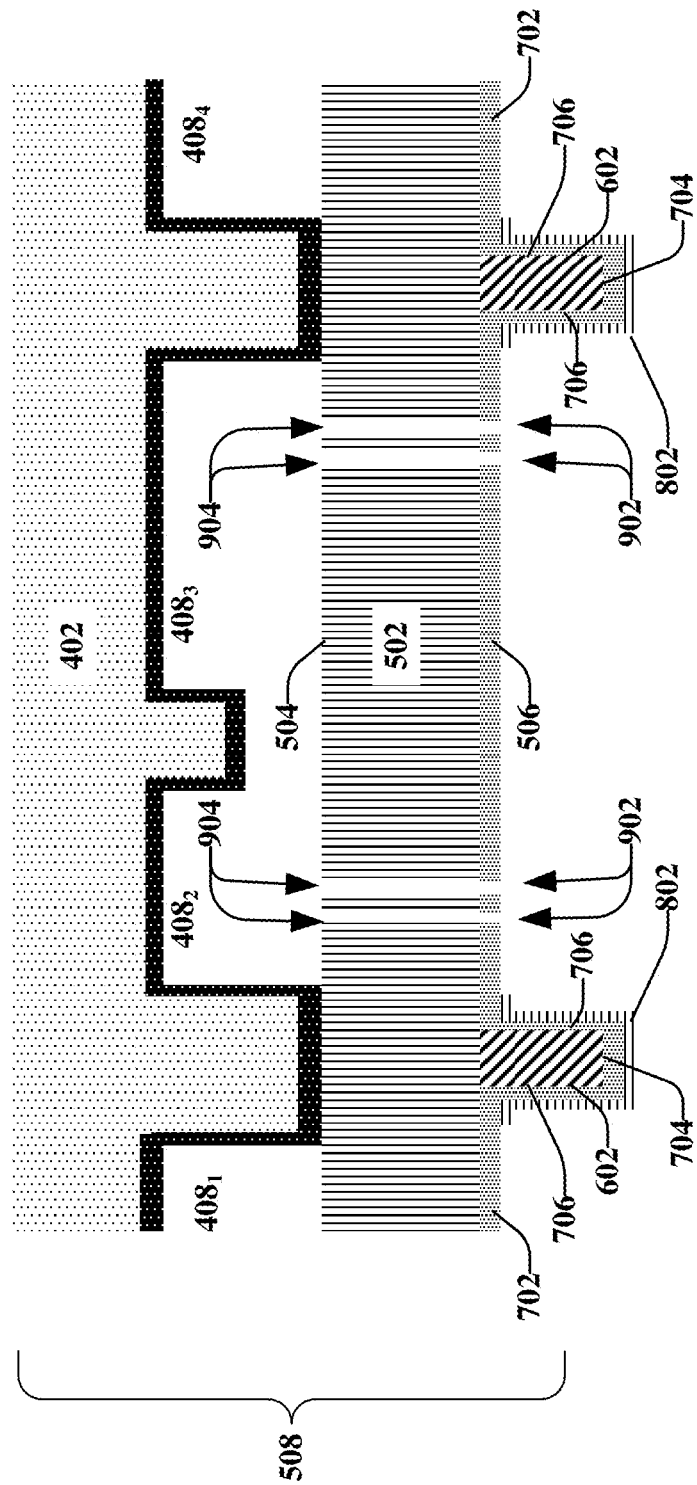
FIG. 9 illustrates a cross-sectional view of a stage of formation of a MEMS layer comprising device layer patterning in accordance with one or more embodiments described herein.

FIG. 9 illustrates a cross-sectional view of a stage of formation of a MEMS layer comprising device layer patterning in accordance with one or more embodiments described herein. Repetitive description of like elements employed in other embodiments described herein is omitted for sake of brevity.

The device layer 502 can undergo lithography and etch processes. For example, the device layer 502 can undergo a Deep Reactive-Ion Etching (DRIE) process to create deep penetration, steep-sided holes, and trenches in the device layer 502. As an example, after the lithography and etch process one or more portions 902 of the rough polysilicon 702 can be removed (two such portions are illustrated for purposes of explanation). Further, one or more etches 904 can be made in the device layer 506 (four such etches are illustrated for purposes of explanation).

Figure 10:
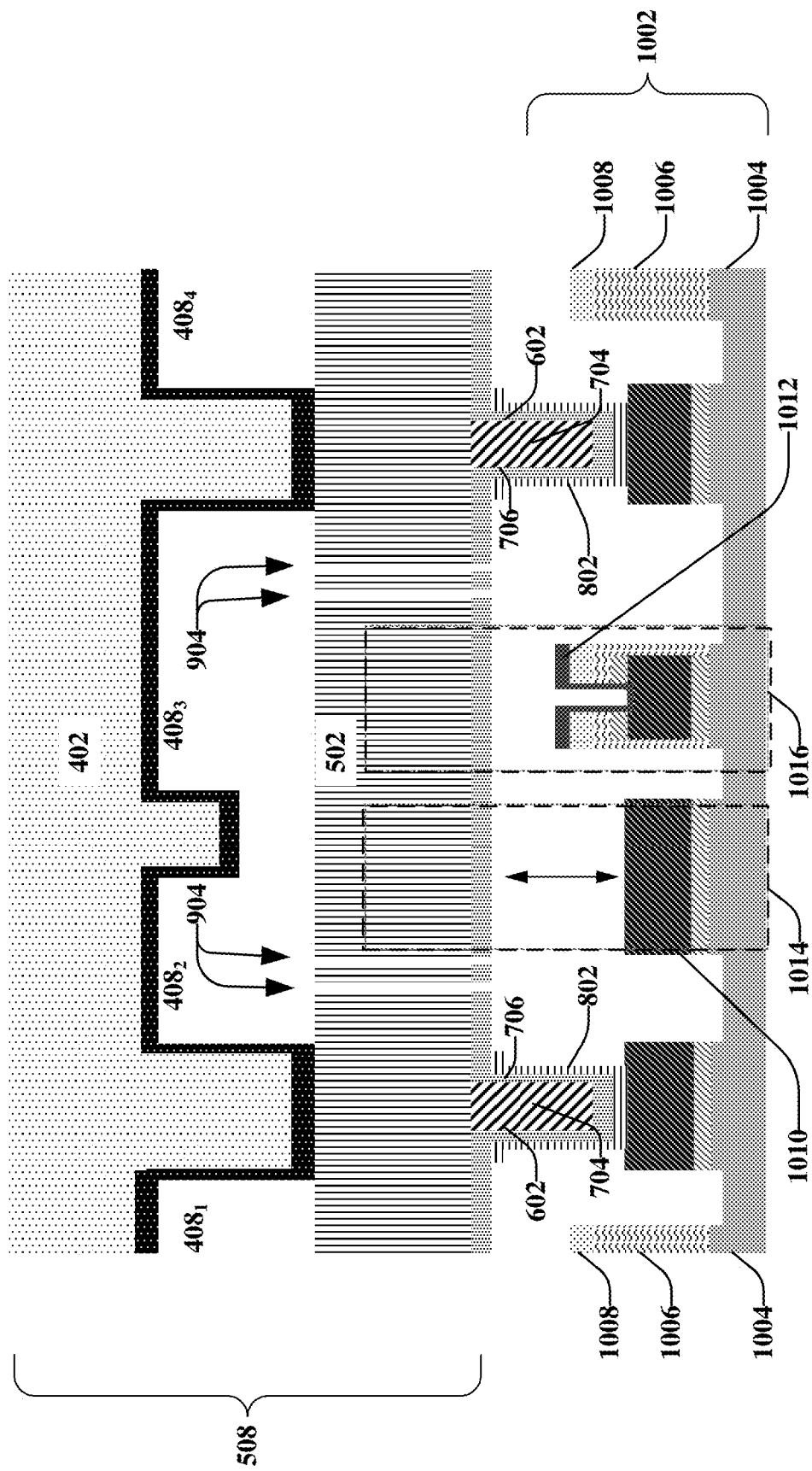
FIG. 10 illustrates an example, non-limiting, device that comprises the MEMS layer of FIGS. 4-9 in accordance with one or more embodiments described herein.

FIG. 10 illustrates an example, non-limiting, device that comprises the MEMS layer of FIGS. 4-9 in accordance with one or more embodiments described herein. Repetitive description of like elements employed in other embodiments described herein is omitted for sake of brevity.

The MEMS layer 508 of FIGS. 4-9 can be bonded to a CMOS portion 1002. For example, the bonding can comprise eutectic bonding according to some implementations. The CMOS portion 1002 can comprise an IMD layer 1004, a passivation oxide layer 1006, and a passivation nitride layer 1008. The CMOS portion 1002 can also comprise a top metal 1010, which can comprise Aluminum Copper (AlCu), for example. A conductive bump stop layer 1012 can comprise, for example, Titanium Nitride (TiN). The vertical sensing gap is indicated by the first boxed area 1014. The vertical bump stop (conductive) is indicated by the second boxed area 1016.

Figure 11:
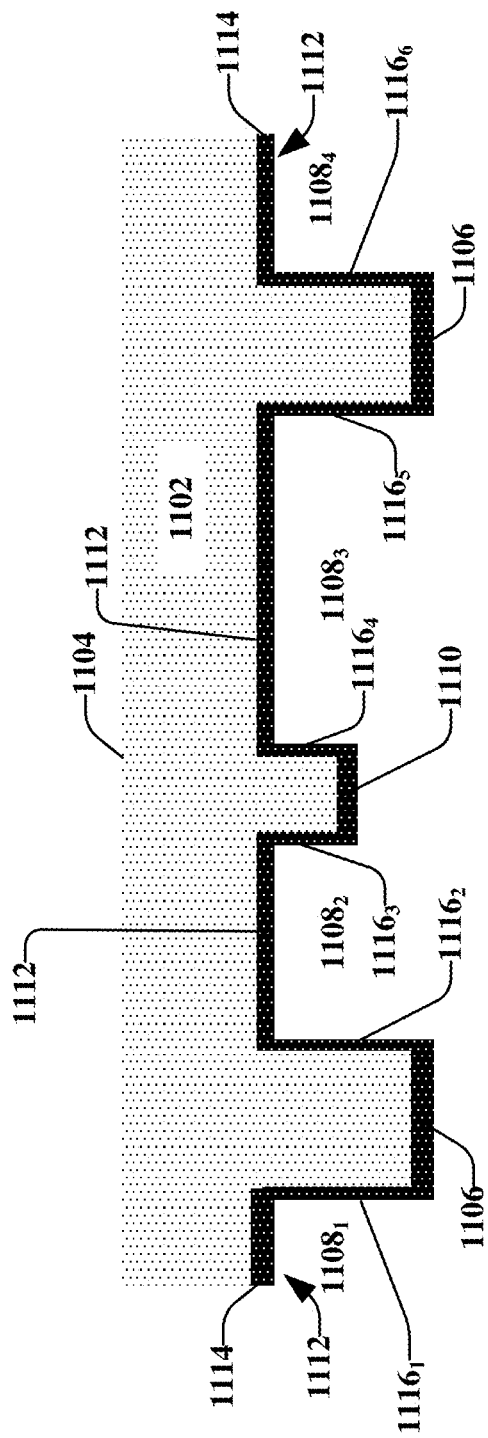
FIG. 11 illustrates a cross-sectional view of a first stage of formation of a MEMS layer with silicidation in accordance with one or more embodiments described herein.

FIGS. 11-19 illustrate an example, non-limiting, MEMS layer process flow for silicidation in accordance with one or more embodiments described herein. FIG. 11 illustrates a cross-sectional view of a first stage of formation of a MEMS layer with silicidation in accordance with one or more embodiments described herein. A handle MEMS layer 1102 is illustrated. The handle MEMS layer 1102 can refer to a substrate that can be used as a carrier for a thinner substrate. The handle MEMS layer 1102 can have a thickness that is thicker than other substrates. The handle MEMS layer 1102 can initially comprise a first handle surface 1104 and a second handle surface 1106. The first handle surface 1104 and the second handle surface 1106 are on opposite sides of the handle MEMS layer 1102.

One or more cavities can be formed in the handle MEMS layer 1102. A cavity refers to an opening or recession in a substrate layer (e.g., the handle MEMS layer 1102). In the example illustrated, there are four cavities, namely, a first cavity 1108$_1$, a second cavity 1108$_2$, a third cavity 1108$_3$, and a fourth cavity 1108$_4$. In some cases, the second cavity 1108$_2$ and the third cavity 1108$_3$ can be considered a single cavity. Although four cavities are illustrated, another number of cavities (e.g., one or more) can be formed in the handle MEMS layer 1102 according to various implementations.

As illustrated, after the one or more cavities are formed, the handle MEMS layer 1102 can have additional surfaces, such as the third handle surface 1110. The third handle surface 1110 represents a portion of the handle MEMS layer 1102 that is not as thick as the portions represented by the second handle surface 1106. Further, the third handle surface can be thicker than a fourth handle surface 1112 formed by the one or more cavities. The third handle surface 1110 and the fourth handle surface 1112 are a same side of the handle MEMS layer 1102 as the second handle surface 1106 (e.g., the first handle surface is on the opposite side of the handle MEMS layer 1102).

Upon or after the cavity formation, an insulating layer 1114 can be bonded to the handle MEMS layer 1102. According to an implementation, the insulating layer 1114 can be an oxide layer. For example, the oxide layer can be bonded to the handle MEMS layer 1102 via fusion bond oxide deposition.

The insulating layer 1114 can line the handle MEMS layer 1102. For example, the insulating layer 1114 can cover the second handle surface 1106, the third handle surface 1110, and the fourth handle surface 1112. Further, the insulating layer 1114 can cover the sides of the portions of the handle MEMS layer 1102 that are formed by the one or more cavities, as indicated at side portions 1116$_1$, 1116$_2$, 1116$_3$, 1116$_4$, 1116$_5$, and 1116$_6$.

Figure 12:
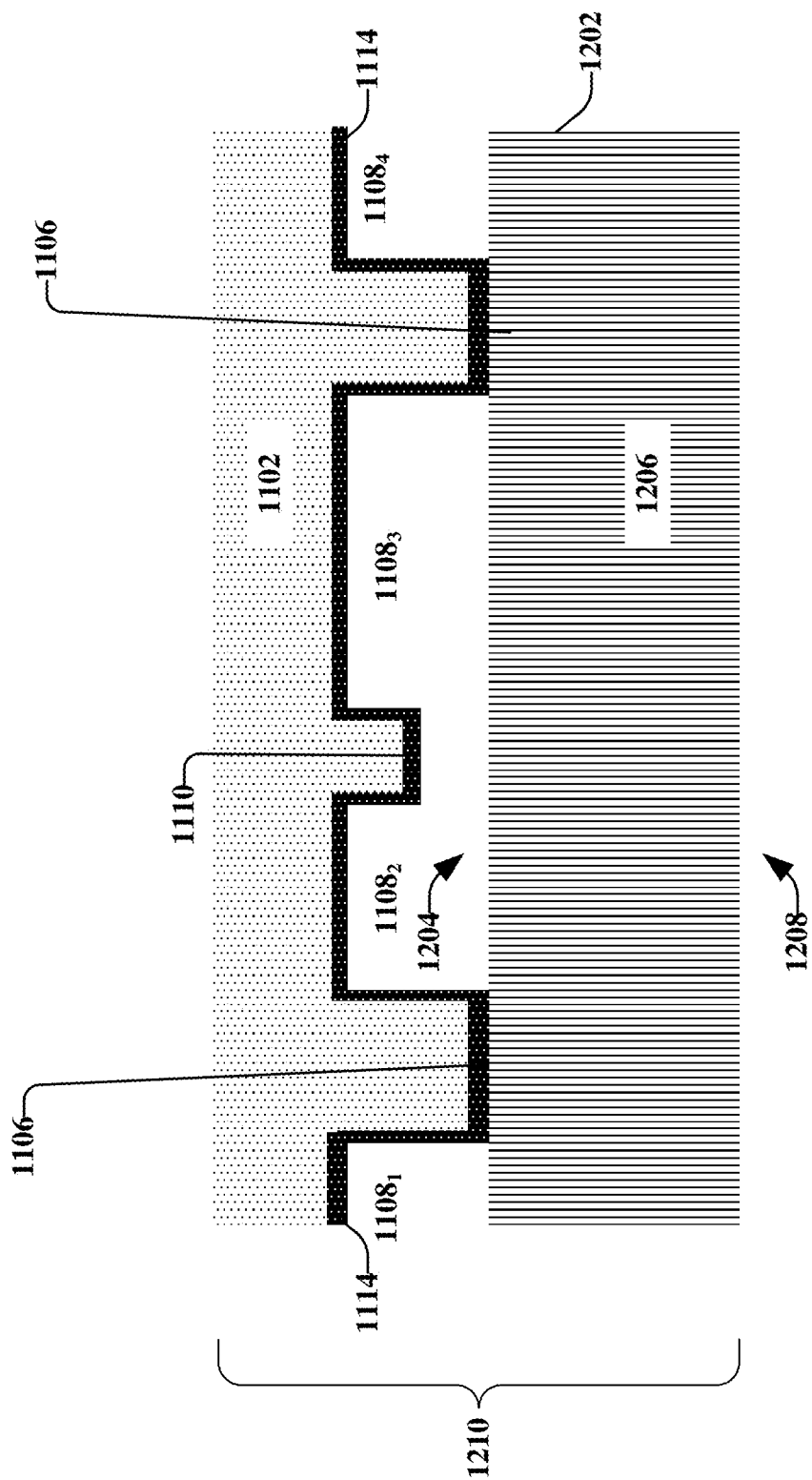
FIG. 12 illustrates a cross-sectional view of a next stage of formation of a MEMS layer with silicidation comprising fusion bond and thinning processes in accordance with one or more embodiments described herein.

FIG. 12 illustrates a cross-sectional view of a next stage of formation of a MEMS layer with silicidation comprising fusion bond and thinning processes in accordance with one or more embodiments described herein. Repetitive description of like elements employed in other embodiments described herein is omitted for sake of brevity.

At least a portion of the handle MEMS layer 1102 can be bonded to at least a portion of a silicon layer 1202. For example, as illustrated, the second handle surface 1106 of the handle MEMS layer 1102 can be bonded to corresponding portions of a first surface area 1204 of the silicon layer 1202. According to some implementations, the silicon layer can comprise doped silicon. The doped silicon can be, for example, P+ doped, N+ doped, N++ doped, and so on. The bonding can comprise fusion bonding or another fusion technique or fusion process.

Upon or after the bonding, a grinding and polishing process (or separate grinding and polishing processes) can be performed to form a device layer 1206. According to some implementations, chemical-mechanical polishing or planarization (CMP) can be performed on the silicon layer. CMP is a polishing process that can be utilized to smooth surfaces. For example, CMP can utilize a chemical slurry formation and a mechanical polishing process to obtain the smooth surfaces. As illustrated, the CMP can create a level surface across at least a second surface area 1208 of the silicon layer 1202 to form the device layer 1206. The first surface area 1204 and the second surface area 1208 are located on opposite sides of the device layer 1206. The handle MEMS layer 1102 and the device layer 1206 together can form a MEMS layer 1210.

Figure 13:
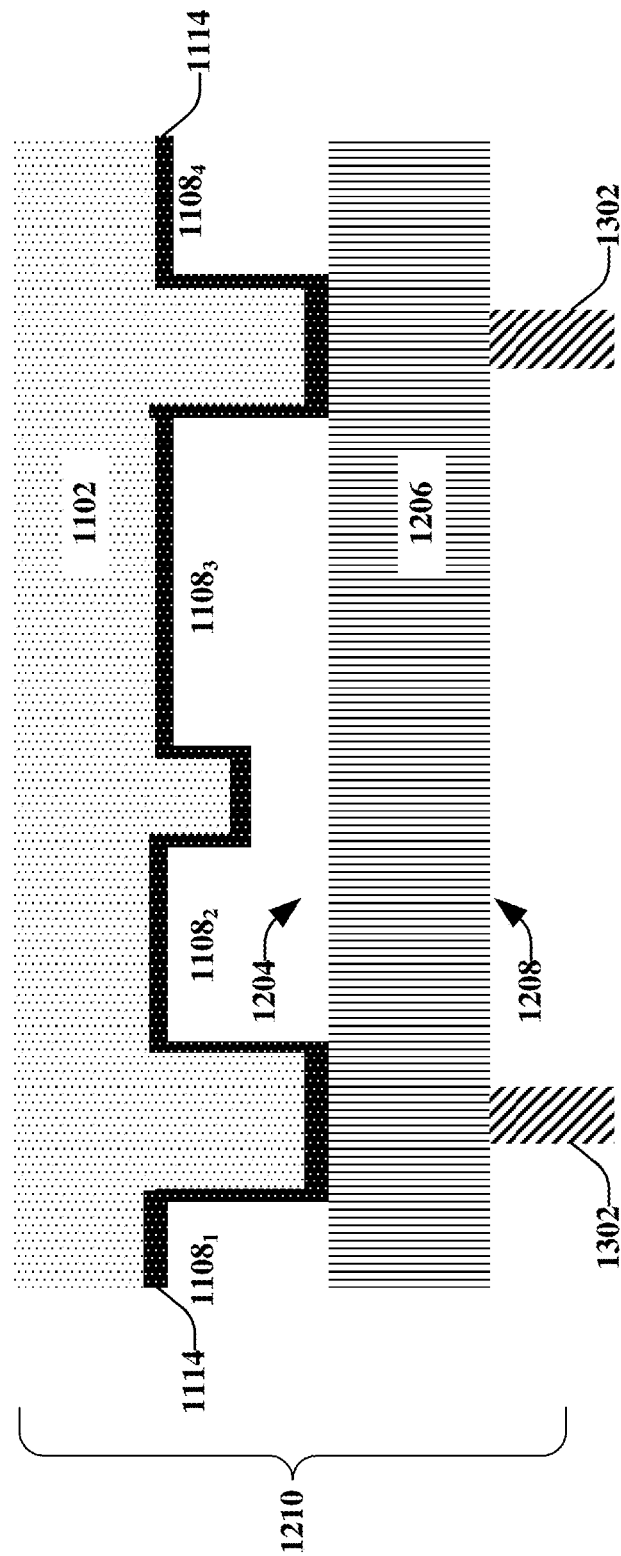
FIG. 13 illustrates a cross-sectional view of a next stage of formation of a MEMS layer with silicidation comprising standoff patterning in accordance with one or more embodiments described herein.

FIG. 13 illustrates a cross-sectional view of a next stage of formation of a MEMS layer with silicidation comprising standoff patterning in accordance with one or more embodiments described herein. Repetitive description of like elements employed in other embodiments described herein is omitted for sake of brevity.

Upon or after the formation of the device layer 1206, one or more standoffs 1302 can be provided on the second surface area 1208 of the device layer 1206. Illustrated are two standoffs, however, the disclosed aspects are not limited to this implementation and fewer or more standoffs can be provided on the second surface area 1208 of the device layer 1206. According to some implementations, the one or more standoffs 1302 can be patterned on the device layer 1206.

Figure 14:
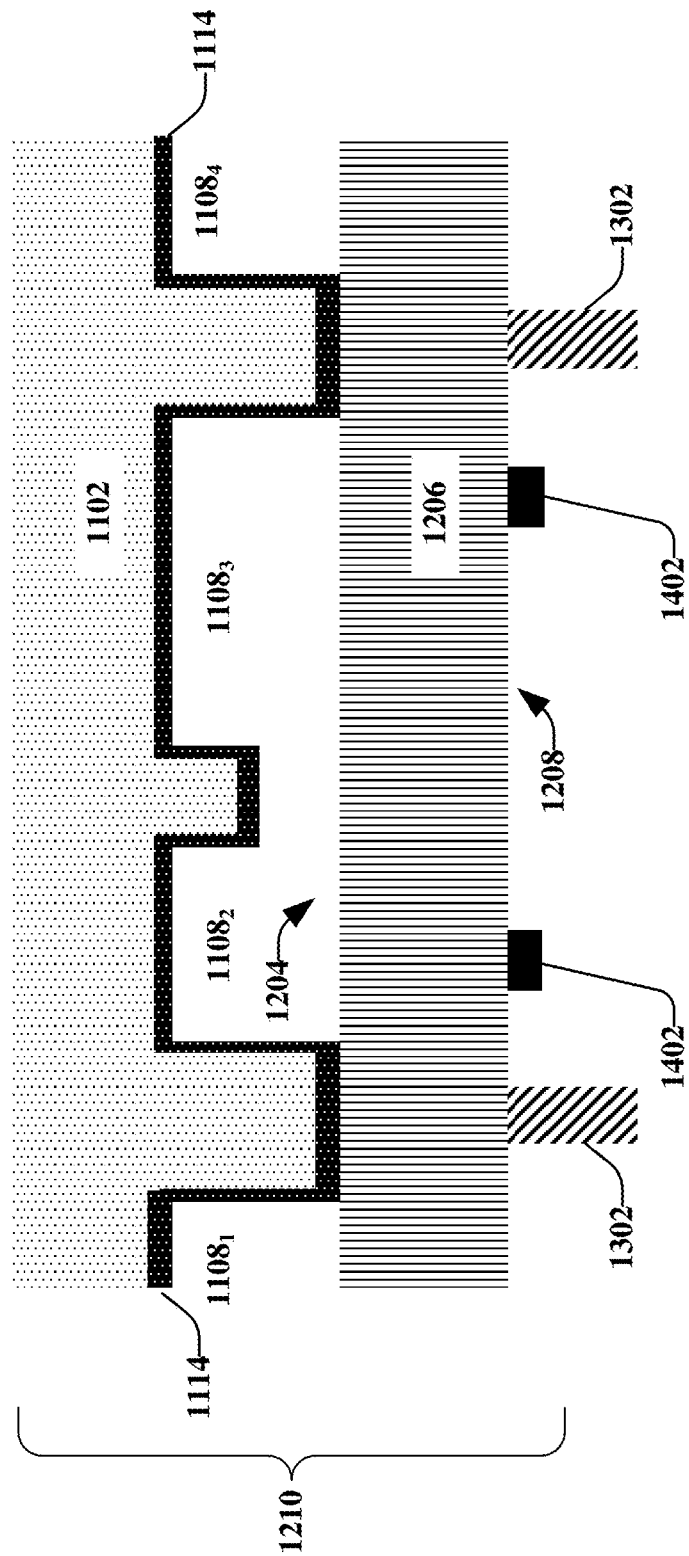
FIG. 14 illustrates a cross-sectional view of formation of a MEMS layer with silicidation comprising hard mask deposition and patterning in accordance with one or more embodiments described herein.

FIG. 14 illustrates a cross-sectional view of formation of a MEMS layer with silicidation comprising hard mask deposition and patterning in accordance with one or more embodiments described herein. Repetitive description of like elements employed in other embodiments described herein is omitted for sake of brevity.

Upon or after the one or more standoffs 1302 are provided, one or more hard masks 1402 can be deposited on a single crystal silicon. For example, the one or more hard masks 1402 can be deposited at respective portions of the second surface area 1208 of the silicon layer. The hard mask deposition can be, for example, oxide. The single crystal silicon can be a P+ doped silicon, an N+ doped silicon, an N++ doped silicon, and so on, according to some implementations.

Upon or after the hard mask deposition, the one or more hard masks 1402 can be patterned. For example, one mask (e.g., an additional mask) can be used for the hard mask deposition. The one mask can be, for example, a silicide block mask.

Figure 15:
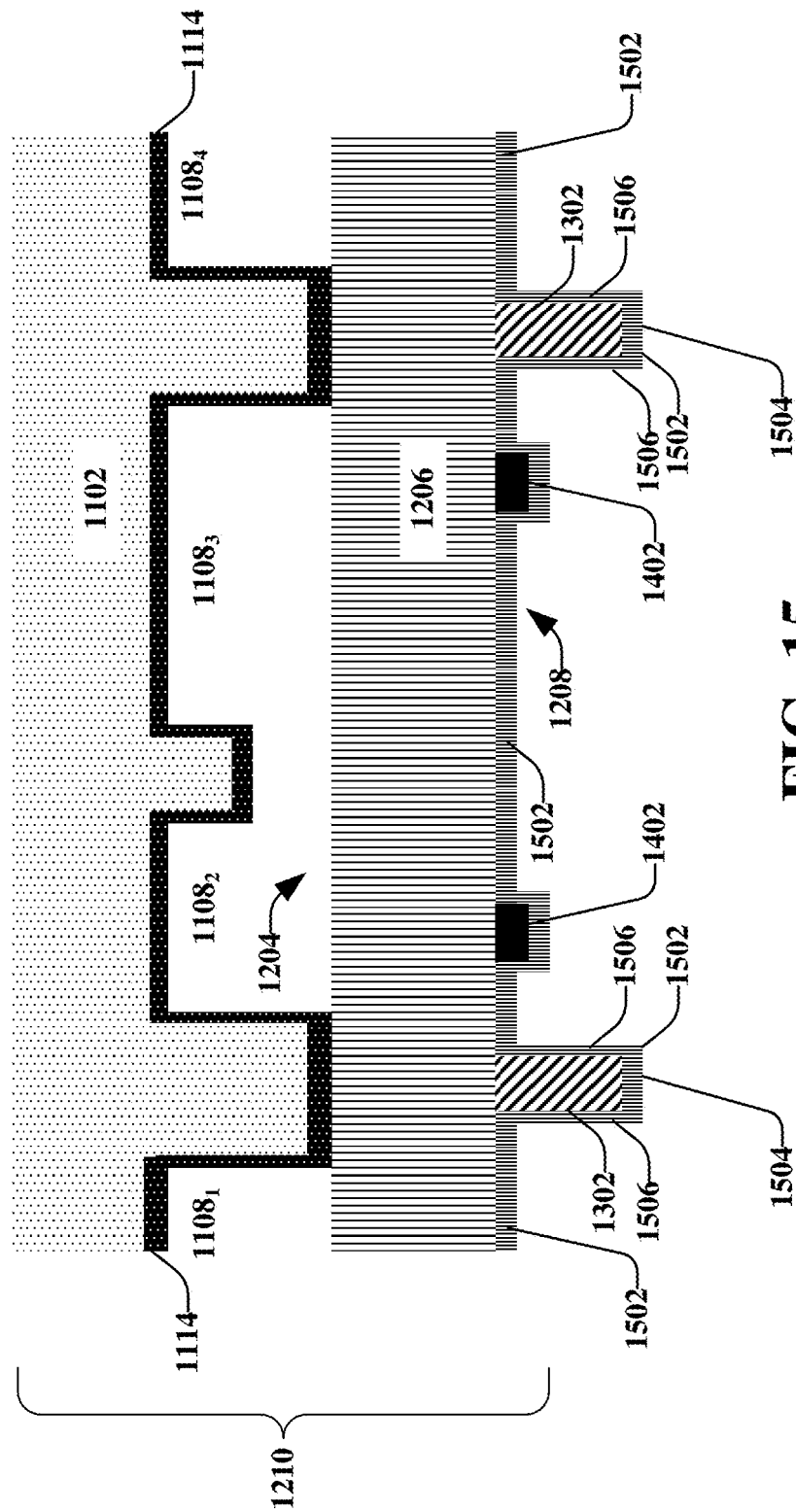
FIG. 15 illustrates a cross-sectional view of formation of a MEMS layer with silicidation comprising metal deposition in accordance with one or more embodiments described herein.

FIG. 15 illustrates a cross-sectional view of formation of a MEMS layer with silicidation comprising metal deposition in accordance with one or more embodiments described herein. Repetitive description of like elements employed in other embodiments described herein is omitted for sake of brevity.

A metal layer 1502 can be deposited on the second surface area 1208 of the device layer 1206 as well as on respective bottom surfaces 1504 and side surfaces 1506 of the one or more standoffs 1302. The metal layer can comprise a material including, but not limited to, Cobalt (Co), Titanium (Ti), Nickel (Ni), and Platinum (Pt).

Figure 16:
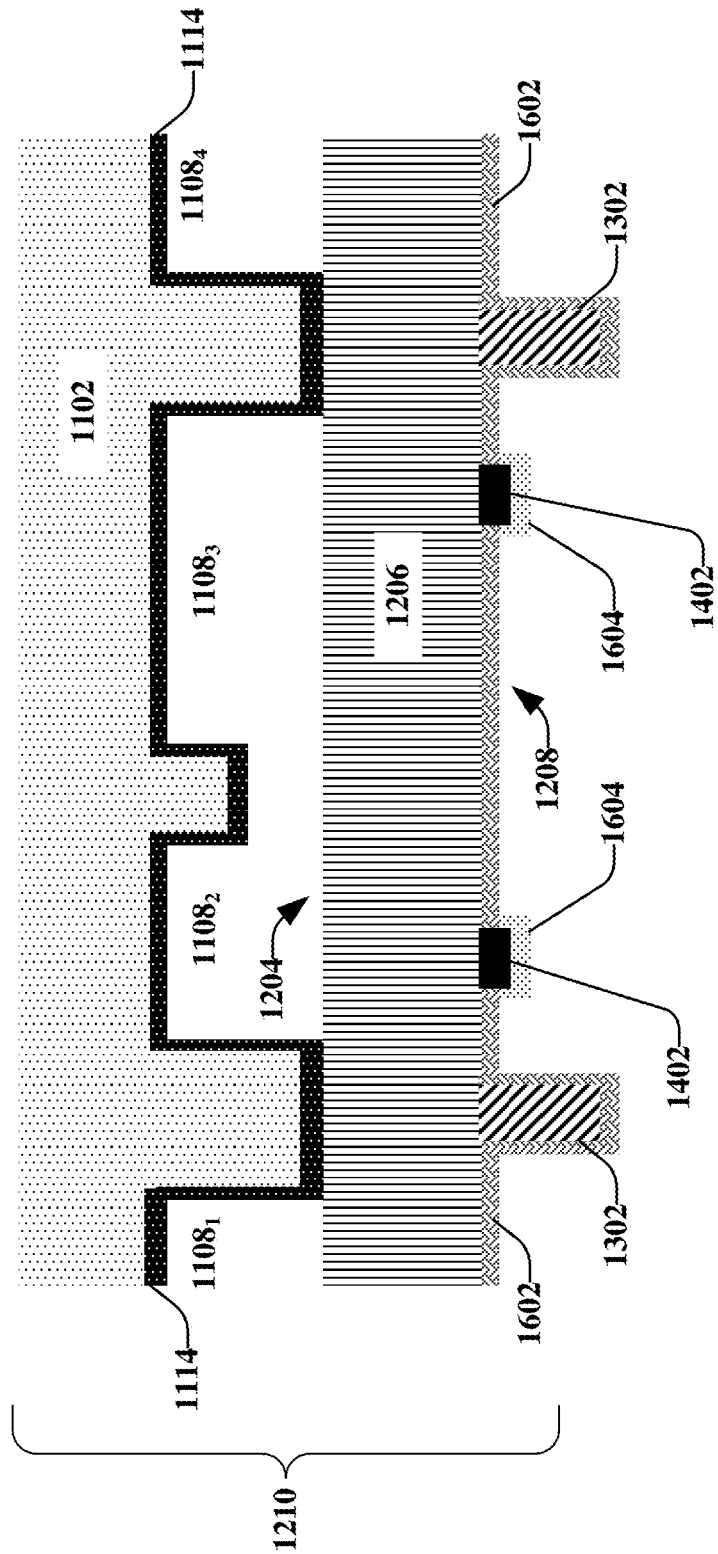
FIG. 16 illustrates a cross-sectional view of formation of silicidation during formation of the MEMS layer in accordance with one or more embodiments described herein.

FIG. 16 illustrates a cross-sectional view of formation of silicidation during formation of the MEMS layer with silicidation in accordance with one or more embodiments described herein. Repetitive description of like elements employed in other embodiments described herein is omitted for sake of brevity.

Upon or after deposition of the metal layer 1502, heat can be applied. The heating can allow the metal layer (e.g., the metal layer 1502) to react with exposed silicon to form silicide 1602. The silicide can comprise, for example, cobalt disilicide (COSi2) or citanium disilicide (TiSi2). One or more portions of the metal layer 1502, which are not in contact with the silicon, can be unreacted metal after the heating. For example, as illustrated, the portions of the metal layer 1502 applied to the one or more hard masks 1402 can be unreacted metal 1604.

Figure 17:
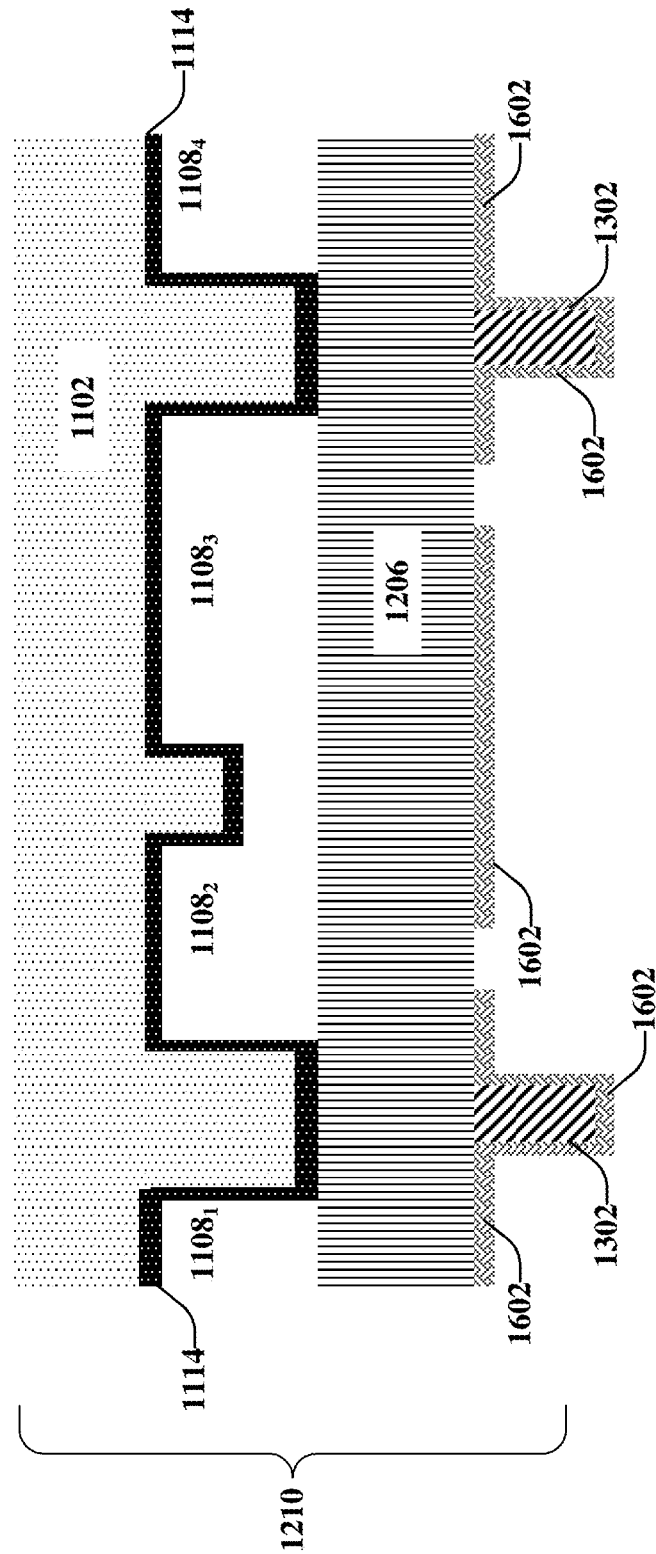
FIG. 17 illustrates a cross-sectional view of another process for formation of a MEMS layer with silicidation comprising metal deposition in accordance with one or more embodiments described herein.

FIG. 17 illustrates a cross-sectional view of another process for formation of a MEMS layer with silicidation comprising metal deposition in accordance with one or more embodiments described herein. Repetitive description of like elements employed in other embodiments described herein is omitted for sake of brevity.

As illustrated, the unreacted metal 1604 can be removed. For example, the unreacted metal 1604 can be removed by chemical etching. Further, the one or more hard masks 1402 can be removed.

Figure 18:
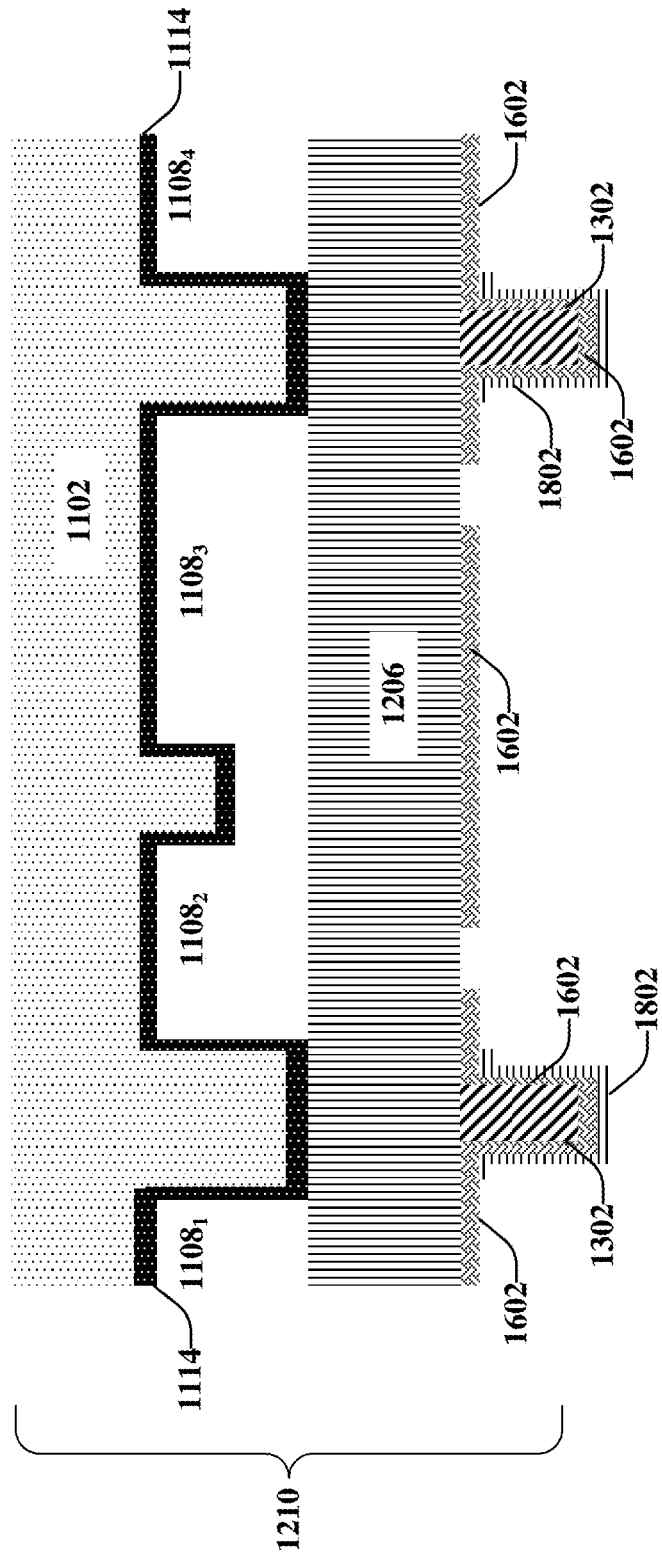
FIG. 18 illustrates a cross-sectional view of another process for formation of a MEMS layer comprising bonding layer deposition and patterning in accordance with one or more embodiments described herein.

FIG. 18 illustrates a cross-sectional view of another process for formation of a MEMS layer comprising bonding layer deposition and patterning in accordance with one or more embodiments described herein. Repetitive description of like elements employed in other embodiments described herein is omitted for sake of brevity.

A bonding layer 1802 can be deposited and patterned. In some cases, the bonding layer 1802 can be applied to portions of the silicide 1602 that are located below and on the sides of the one or more standoffs 1302. For example, the bonding layer 1802 can be provided by depositing and patterning the one or more standoffs 1302. An example material for the bonding layer 1802 can included, but is not limited to, germanium (Ge).

Figure 19:
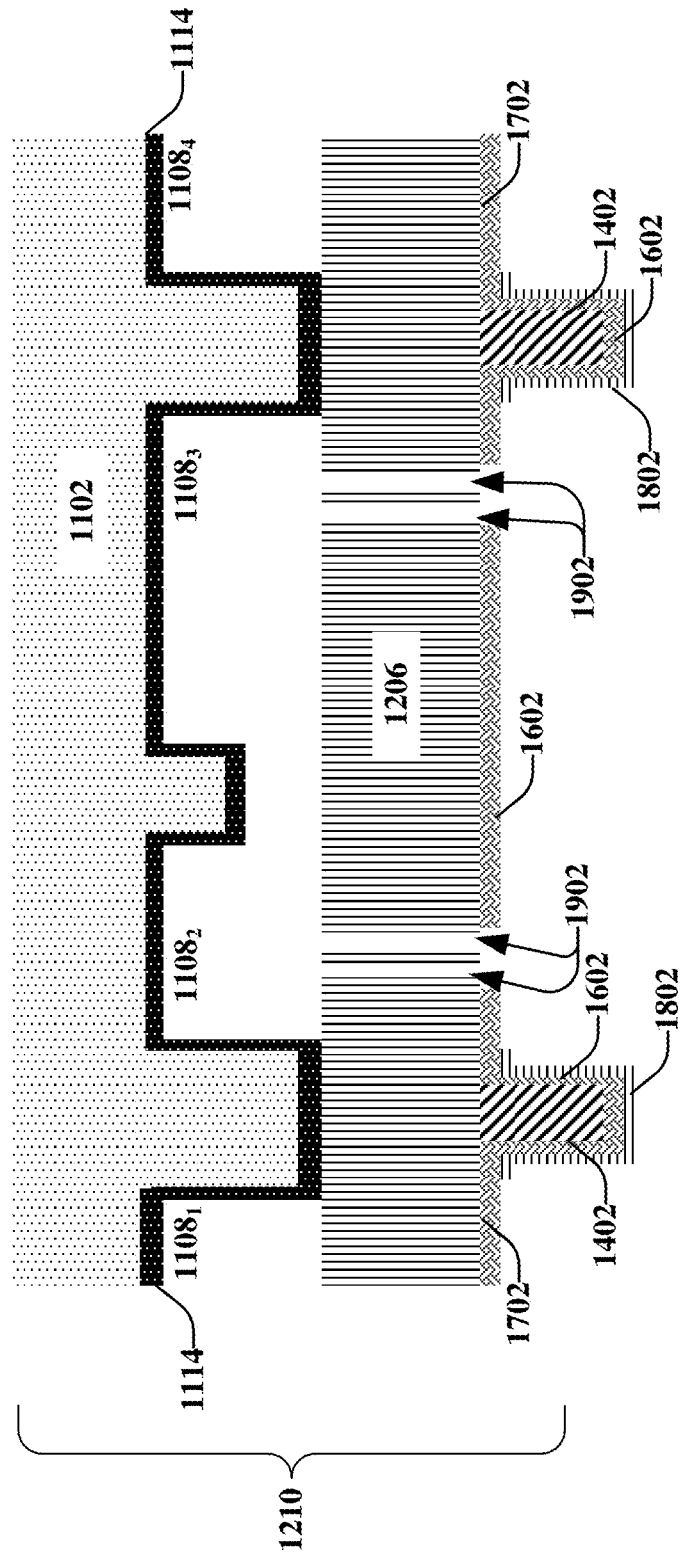
FIG. 19 illustrates a cross-sectional view of another process for formation of a MEMS layer comprising device layer lithography and etch in accordance with one or more embodiments described herein.

FIG. 19 illustrates a cross-sectional view of another process for formation of a MEMS layer comprising device layer lithography and etch in accordance with one or more embodiments described herein. Repetitive description of like elements employed in other embodiments described herein is omitted for sake of brevity.

The device layer 1206 can undergo lithography and etch processes. For example, the device layer 1206 can undergo a DRIE process to create deep penetration, steep-sided holes, and trenches in the device layer 1206. As an example, after the lithography and etch process one or more etches 1902 can be made in the device layer 1206 (four such etches are illustrated for purposes of explanation).

Figure 20:
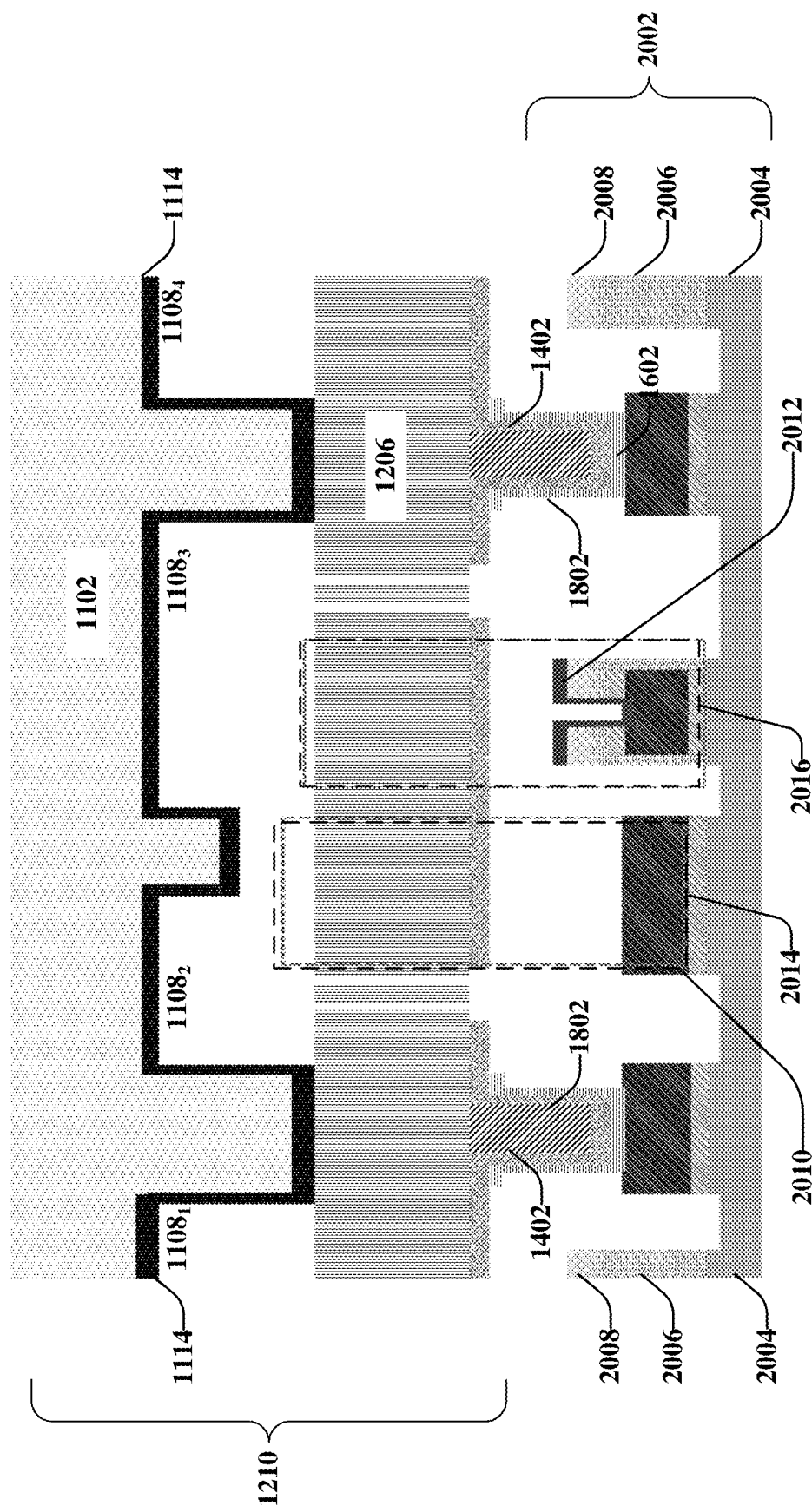
FIG. 20 illustrates an example, non-limiting, device that comprises the MEMS layer of FIGS. 11-19 in accordance with one or more embodiments described herein.

FIG. 20 illustrates an example, non-limiting, device that comprises the MEMS layer of FIGS. 11-19 in accordance with one or more embodiments described herein. Repetitive description of like elements employed in other embodiments described herein is omitted for sake of brevity.

The MEMS layer 1210 of FIGS. 11-19 can be bonded to a CMOS portion 2002. For example, the bonding can comprise eutectic bonding according to some implementations. The CMOS portion 2002 can comprise an IMD layer 2004, a passivation oxide layer 2006, and a passivation nitride layer 2008. The CMOS portion 2002 can also comprise a top metal 2010, which can comprise Aluminum Copper (AlCu), for example. A conductive bump stop layer 2012 can comprise, for example, Titanium Nitride (TiN). The vertical sensing gap is indicated by the first boxed area 2014. The vertical bump stop (conductive) is indicated by the second boxed area 2016.

Methods that can be implemented in accordance with the disclosed subject matter will be better appreciated with reference to various flow charts. While, for purposes of simplicity of explanation, the methods are shown and described as a series of blocks, it is to be understood and appreciated that the disclosed aspects are not limited by the number or order of blocks, as some blocks can occur in different orders and/or at substantially the same time with other blocks from what is depicted and described herein. Moreover, not all illustrated blocks can be required to implement the disclosed methods. It is to be appreciated that the functionality associated with the blocks can be implemented by software, hardware, a combination thereof, or any other suitable means (e.g., device, system, process, component, and so forth). Additionally, it should be further appreciated that the disclosed methods are capable of being stored on an article of manufacture to facilitate transporting and transferring such methods to various devices. Those skilled in the art will understand and appreciate that the methods could alternatively be represented as a series of interrelated states or events, such as in a state diagram.

Figure 21:
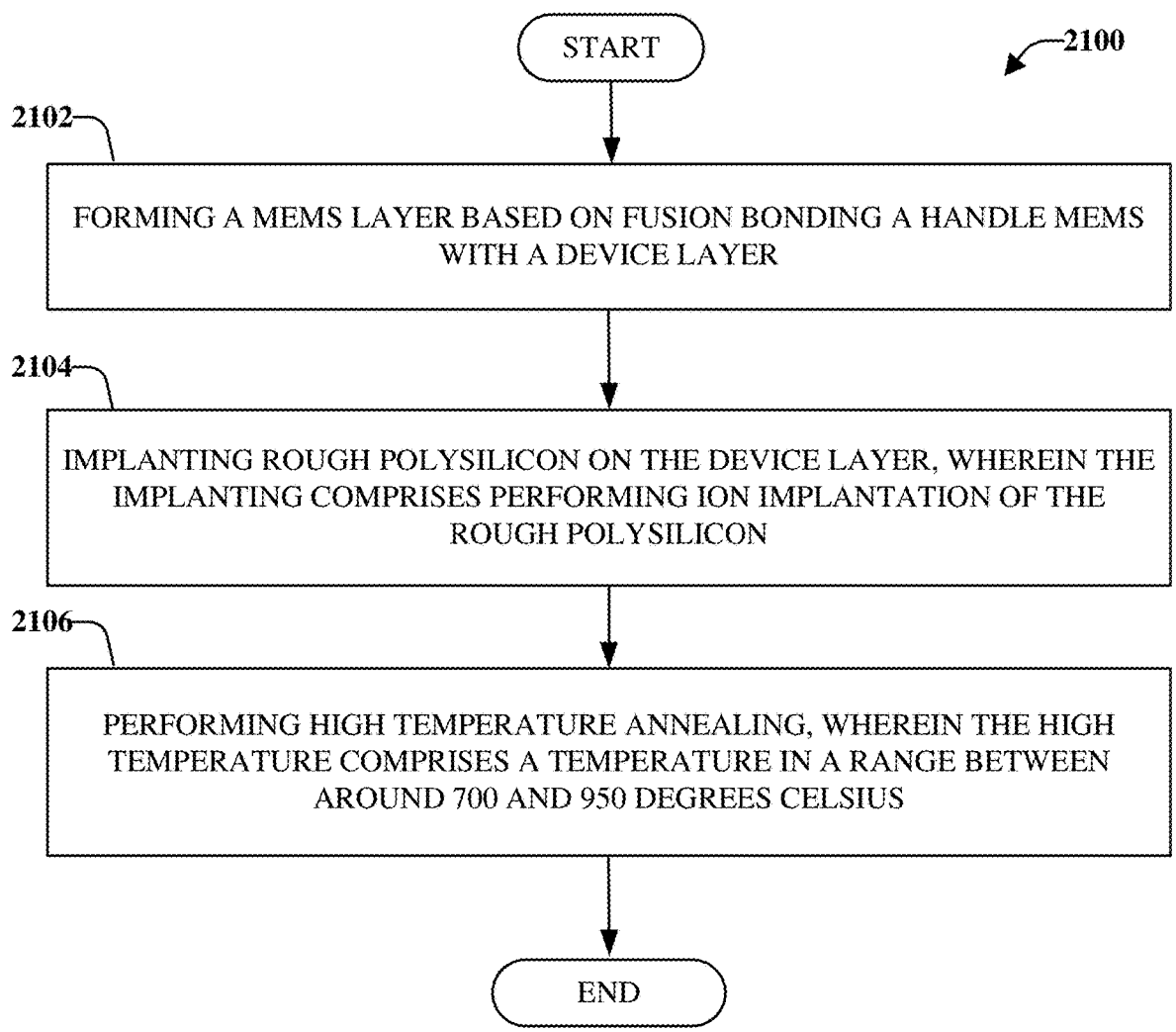
FIG. 21 illustrates a flow diagram of an example, non-limiting, method for fabricating a MEMS device in accordance with one or more embodiments described herein.

FIG. 21 illustrates a flow diagram of an example, non-limiting, method 2100 for fabricating a MEMS device in accordance with one or more embodiments described herein. The method 2100 can start, at 2102 with forming a MEMS layer based on fusion bonding a handle MEMS (e.g., the handle MEMS layer 402) with a device layer (e.g., the device layer 1206). At 2104, rough polysilicon (e.g., the rough polysilicon 702) can be implanted on the device layer. The rough polysilicon can be undoped according to some implementations. For example, implanting the rough polysilicon can comprise performing ion implantation of the rough polysilicon. Performing the ion implantation can increase a surface roughness of the rough polysilicon.

The method 2100 can continue, at 2106 with performing high temperature annealing. The high temperature can comprise a temperature in a range between around 700 and 1100 degrees Celsius. The temperature can be higher than another temperature utilized for a polysilicon deposited on a single crystal silicon. According to some implementations, performing the high temperature annealing can comprise doping the rough polysilicon from implanted dopants.

Figure 22:
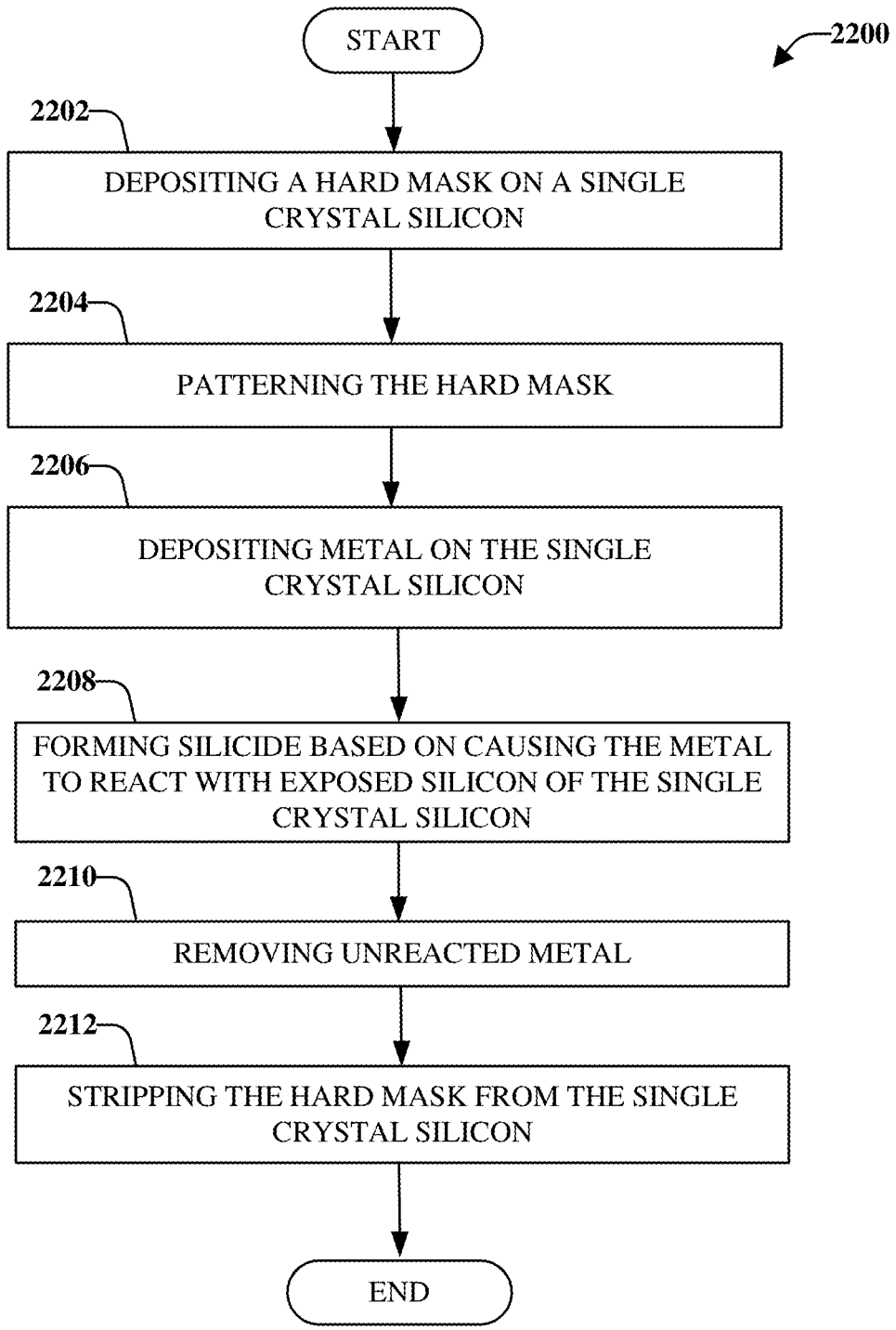
FIG. 22 illustrates a flow diagram of an example, non-limiting, method for fabricating a MEMS device in accordance with one or more embodiments described herein.

FIG. 22 illustrates a flow diagram of an example, non-limiting, method 2200 for fabricating a MEMS device in accordance with one or more embodiments described herein. The method 2200 can start, at 2202 when a hard mask (e.g., the one or more hard masks 1402) is deposited on a single crystal silicon (e.g., the silicon layer 1202). The hard mask can be patterned, at 2204.

Further, at 2206, metal (e.g., the metal layer 1502) can be deposited on the single crystal silicon. The metal can comprise at least one of titanium (Ti), cobalt (Co), nickel (Ni), platinum (Pt), tantalum (Ta), and tungsten (W).

Silicide (e.g., the silicide 1602) can be formed, at 2208, based on causing the metal to react with exposed silicon of the single crystal silicon. Causing the metal to react can comprise heating the metal to a temperature between about 400 degrees Celsius and 1000 degrees Celsius.

In some implementations, the silicide can comprise cobalt (Co), which can be formed at a temperature around 600 degrees Celsius to about 800 degrees Celsius. According to some implementations, the silicide can comprise cobalt disilicide ($CoSi_2$). The silicide can comprise titanium (Ti), which can be formed at a temperature around 700 degrees Celsius to around 900 degrees Celsius. In alternative, or additional, implementations, the silicide can comprise titanium disilicide ($TiSi_2$). In another example, the silicide can comprise Nickel (Ni), which can be formed at a temperature between approximately 400 degrees Celsius and about 600 degree Celsius. In another example, the silicide can comprise Tungsten (W), which can be formed at a temperature of around 1000 degrees Celsius, Platinum silicide (PtSI), which can be formed at a temperature of around 350 to 550 degrees Celsius, and/or Tantalum silicide ($TaSi_2$), which can be formed at a temperature of around 400 to 900 degrees Celsius.

The unreacted metal (e.g., the unreacted metal 1604) can be removed, at 2210. Additionally, the hard mask can be stripped from the single crystal silicon, at 2212.

Reference throughout this specification to "one embodiment," or "an embodiment," means that a particular feature, structure, or characteristic described in connection with the embodiment is included in at least one embodiment. Thus, the appearances of the phrase "in one embodiment," "in one aspect," or "in an embodiment," in various places throughout this specification are not necessarily all referring to the same embodiment. Furthermore, the particular features, structures, or characteristics can be combined in any suitable manner in one or more embodiments.

In addition, the words "example" and "exemplary" are used herein to mean serving as an instance or illustration. Any embodiment or design described herein as "example" or "exemplary" is not necessarily to be construed as preferred or advantageous over other embodiments or designs. Rather, use of the word example or exemplary is intended to present concepts in a concrete fashion. As used in this application, the term "or" is intended to mean an inclusive "or" rather than an exclusive "or." That is, unless specified otherwise or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

In addition, the various embodiments can be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, machine-readable device, computer-readable carrier, computer-readable media, machine-readable media, computer-readable (or machine-readable) storage/communication media. For example, computer-readable media can comprise, but are not limited to, a magnetic storage device, e.g., hard disk; floppy disk; magnetic strip(s); an optical disk (e.g., compact disk (CD), a digital video disc (DVD), a Blu-ray Disc™ (BD)); a smart card; a flash memory device (e.g., card, stick, key drive); and/or a virtual device that emulates a storage device and/or any of the above computer-readable media. Of course, those skilled in the art will recognize many modifications can be made to this configuration without departing from the scope or spirit of the various embodiments The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the subject matter has been described herein in connection with various embodiments and corresponding figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

What is claimed is:

1. A method of forming a Microelectromechanical System (MEMS) device, comprising:
    depositing a hard mask on a single crystal silicon;
    patterning the hard mask;
    depositing metal on the single crystal silicon;
    forming silicide based on causing the metal to react with exposed silicon of the single crystal silicon;
    removing unreacted metal;
    stripping the hard mask from the single crystal silicon;
    depositing and patterning a bond layer over the silicide; and
    bonding the single crystal silicon to an inter metal dielectric (IMD) layer.

2. The method of claim 1, wherein the metal comprises at least one of titanium (Ti), cobalt (Co), nickel (Ni), platinum (Pt), tantalum (Ta), and tungsten (W).

3. The method of claim 1, wherein the causing the metal to react comprises heating the metal to a temperature between about 400 degrees Celsius and 1000 degrees Celsius.

4. The method of claim 1, wherein the silicide comprises cobalt disilicide (CoSi2).

5. The method of claim 1, wherein the silicide comprises titanium disilicide (TiSi2).

6. The method of claim 1, wherein the silicide comprises cobalt (Co), and wherein the causing the metal to react comprises heating the metal to a temperature between about 600 degrees Celsius to about 800 degrees Celsius.

7. The method of claim 1, wherein the silicide comprises titanium (Ti), and wherein the causing the metal to react comprises heating the metal to a temperature between about 700 degrees Celsius to about 900 degrees Celsius.

8. The method of claim 1, wherein the silicide comprises nickel (Ni), and wherein the causing the metal to react comprises heating the metal to a temperature between about 400 degrees Celsius to about 600 degrees Celsius.

9. The method of claim 1, wherein the silicide comprises tungsten (W), and wherein the causing the metal to react comprises heating the metal to a temperature of around 1000 degrees Celsius.

10. The method of claim 1, wherein the silicide comprises platinum silicide (PtSI), and wherein the causing the metal to react comprises heating the metal to a temperature between about 350 degrees Celsius to about 550 degrees Celsius.

11. The method of claim 1, wherein the silicide comprises Tantalum silicide (TaSi2), and wherein the causing the metal to react comprises heating the metal to a temperature between about 400 degrees Celsius to about 900 degrees Celsius.

12. A Microelectromechanical System (MEMS) device made by the method of claim 1.

13. The MEMS device of claim 12, wherein the silicide comprises cobalt disilicide (CoSi2), titanium disilicide (TiSi2), cobalt (Co), and titanium (Ti).

14. The MEMS device of claim 12, wherein the silicide comprises titanium disilicide (TiSi2).

15. The MEMS device of claim 12, wherein the silicide comprises cobalt (Co).

16. The MEMS device of claim 12, wherein the silicide comprises titanium (Ti).

17. The MEMS device of claim 12, wherein the silicide comprises nickel (Ni) and tungsten (W).

18. The MEMS device of claim 12, wherein the silicide comprises platinum silicide (PtSI) and Tantalum silicide (TaSi2).

19. The method of claim 1, further comprising etching a plurality of trenches in the single crystal silicon.

20. The method of claim 1, wherein the bonding comprises eutectically bonding the bond layer to a metal layer in the IMD layer.

21. The method of claim 20, the IMD layer comprises of a conductive bump stop.

22. A method of forming a Microelectromechanical System (MEMS) device, comprising:
   forming standoffs on a device layer;
   depositing and patterning a hard mask on the device layer;
   depositing a metal layer on the device layer;
   forming silicide based on causing metal of the metal layer to react with exposed silicon of the device layer;
   depositing a bond layer over the standoffs;
   etching the device layer to form MEMS features; and
   bonding the device layer to a Complementary Metal-Oxide-Semiconductor (CMOS) layer.

23. The method of claim 22, further comprising:
   removing unreacted metal; and
   stripping the hard mask from the device layer after the bonding.

24. The method of claim 22, wherein the metal comprises at least one of titanium (Ti), cobalt (Co), nickel (Ni), platinum (Pt), tantalum (Ta), and tungsten (W).

\* \* \* \* \*